(12) United States Patent
Miura et al.

(10) Patent No.: US 9,748,044 B2
(45) Date of Patent: Aug. 29, 2017

(54) PHOTOSENSITIZER AND PHOTOELECTRIC CONVERSION DEVICE

(71) Applicant: Chemicrea Inc., Tokyo (JP)

(72) Inventors: Hidetoshi Miura, Tokyo (JP); Shingo Kajiyama, Tokyo (JP); Yukiko Inoue, Tokyo (JP); Shinji Higashijima, Tokyo (JP)

(73) Assignee: Chemicrea Inc., Tokyo (JP)

( * ) Notice: Subject to any disclaimer, the term of this patent is extended or adjusted under 35 U.S.C. 154(b) by 0 days.

(21) Appl. No.: 15/378,875

(22) Filed: Dec. 14, 2016

(65) Prior Publication Data

US 2017/0092436 A1    Mar. 30, 2017

Related U.S. Application Data

(63) Continuation of application No. PCT/JP2015/002978, filed on Jun. 15, 2015.

(30) Foreign Application Priority Data

Jun. 20, 2014    (JP) .................................. 2014-126802

(51) Int. Cl.
| | |
|---|---|
| H01G 9/20 | (2006.01) |
| H01L 51/00 | (2006.01) |
| C09B 23/01 | (2006.01) |
| H01L 51/42 | (2006.01) |

(52) U.S. Cl.
CPC ....... *H01G 9/2059* (2013.01); *C09B 23/0075* (2013.01); *H01L 51/0052* (2013.01); *H01L 51/0069* (2013.01); *H01L 51/0071* (2013.01); *H01L 51/0072* (2013.01); *H01L 51/4226* (2013.01)

(58) Field of Classification Search
CPC .................................................. H01G 9/2059
See application file for complete search history.

(56) References Cited

U.S. PATENT DOCUMENTS

| 5,463,057 A | 10/1995 | Graetzel et al. |
| 2006/0073410 A1 | 4/2006 | Shibuya |
| 2015/0157745 A1 | 6/2015 | Shintou et al. |

FOREIGN PATENT DOCUMENTS

| GB | 818639 A | 8/1959 |
| JP | H09-216907 A | 8/1997 |
| JP | 2005-19250 A | 1/2005 |
| JP | 3731752 B2 | 1/2006 |
| JP | 2006-39355 A | 2/2006 |
| JP | 2007-66690 A | 3/2007 |
| JP | 4080288 B2 | 4/2008 |
| JP | 2010-169678 A | 8/2010 |

OTHER PUBLICATIONS

Decision to Grant a Patent issued in corresponding Japanese Application No. 2014-126802, mailed on Feb. 9, 2016 (6 pages).
International Search Report issued in corresponding Application No. PCT/JP2015/002978, mailed on Sep. 8, 2015 (5 pages).
Nritten Opinion issued in corresponding Application No. PCT/JP2015/002978, mailed on Sep. 8, 2015 (4 pages).
Brian O'Regan et al.; "A low-cost, high efficiency solar cell based on dye-sensitized colloidal TiO2 films"; Nature; vol. 353; pp. 737-740; 1991 (4 pages).
Office Action issued in counterpart Korean Patent Application No. 1020167035166, dated Jun. 19, 2017 (7 pages).
A. Singh et al., "Tuning Solid-State Fluorescence to the Near-Infrared: A Combinatorial Approach to Discovering Molecular Nanoprobes for Biomedical Imaging". ACS Applied Materials & Interfaces, vol. 5, pp. 8881-8888, 2013 (8 pages).

*Primary Examiner* — Shawquia Jackson
(74) *Attorney, Agent, or Firm* — Osha Liang LLP

(57) ABSTRACT

A photosensitizer is a dye represented by the following formula (I) or its salt. In the following chemical formula, m represents an integer of 0 through 4, and n represents an integer of 0 or 1, and p represents an integer of 0 to 2. $R_1$, $R_2$ and $R_3$ represent a hydrogen atom, an alkyl group, an aryl group or the like. $R_4$, $R_4'$, $R_4''$, $R_5$, $R_6$, $R_7$, $R_8$ and $R_9$ represent a hydrogen atom, an alkyl group and the like. X represents a carbonyl group or the like. $Z_1$ and $Z_2$ represent a carboxyl group or the like:

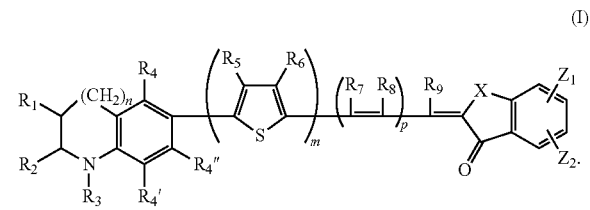

(I)

2 Claims, 1 Drawing Sheet

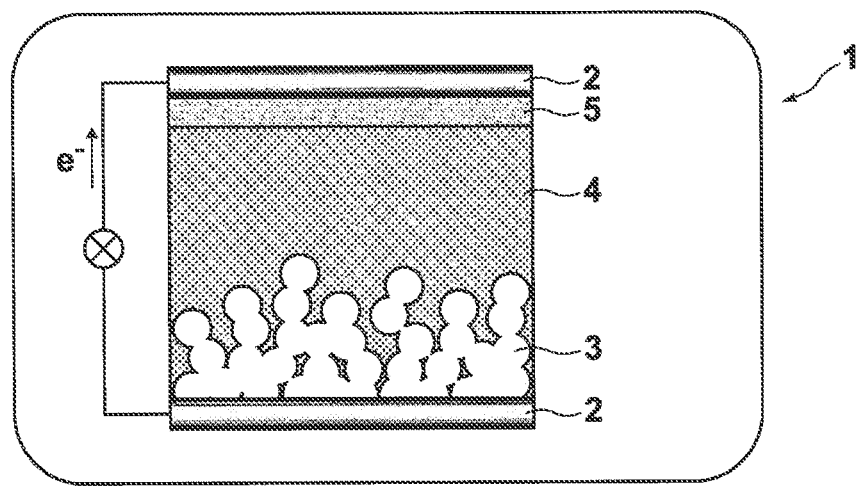

US 9,748,044 B2

PHOTOSENSITIZER AND PHOTOELECTRIC CONVERSION DEVICE

CROSS-REFERENCE TO RELATED APPLICATIONS

This application is a Continuation of PCT International Application No. PCT/JP2015/002978 filed on Jun. 15, 2015, which claims priority under 35 U.S.C. §119(a) to Japanese Patent Application No. 2014-126802 filed on Jun. 20, 2014. Each of the above applications is hereby expressly incorporated by reference, in its entirety, into the present application.

BACKGROUND

The present disclosure relates to a photosensitizer and a photoelectric conversion device using the photosensitizer.

Organic solar cells, which have been attracting attention in recent years as next-generation solar cells, are roughly classified into an organic thin-film type and a dye-sensitization type. The organic thin-film solar cell utilizes a p-n junction created by combining organic materials, and its work mechanism is exactly the same as that of an inorganic solar cell, typified by silicon. In contrast, the dye-sensitized solar cell (Dye Sensitized Solar Cell: DSC) is characterized by use of a modified electrode in which an organic dye, as a photosensitizer, is combined with an inorganic semiconductor, such as titanium oxide and zinc oxide. Further, the work mechanism of the dye-sensitized solar cell is also completely different from that of an inorganic solar cell, and rather close to photosynthesis. Such a solar cell, which may be regarded as an inorganic-organic hybrid molecular device, is drawing attention, particularly, as a low-cost solar cell (Brian O'Regan and Michael Gratzel, "A low-cost, high-efficiency solar cell based on dye-sensitized colloidal $TiO_2$ films", Nature, Vol. 353, pp. 737-740, 1991 (Non-Patent Document 1)).

Further, all the conventional solar cells have a monochromatic hue and fail to have excellent design characteristics. In contrast, the dye-sensitized solar cells are producible in various hues, such as red, blue and yellow, just by changing the kind of dye. Such a wide variation in color gives also very excellent design characteristics, and use for various purposes and their market growth are expected.

The working electrode of the dye-sensitized solar cell is produced by depositing an inorganic semiconductor, such as titanium oxide and zinc oxide, on a conductive substrate by sintering, and by causing the inorganic semiconductor to adsorb sensitizing dye. Since the dye-sensitized solar cell has simple structure in which space between the working electrode and a counter electrode, such as platinum, is filled with iodine-based electrolyte solution, manufacture is easy. Further, since no special equipment, such as a vacuum line, is required in manufacture, reduction in cost is easier than conventional solar cells. Especially, a so-called Gratzel DSC, which requires no investment on special equipment as well as using low cost materials for an electrode and the like, has a high probability of greatly reducing the cost. As the electrode of the Gratzel DSC, porous titanium oxide having a high roughness factor, and which has been produced by sintering nanoparticles at high temperature, is used. Currently, high conversion efficiency of 12% or higher is achieved by combining a ruthenium dye, as photosensitizer, with the porous titanium oxide. Therefore, production for sale in the near future is expected.

However, there remain problems to be solved also for practical use of such a Gratzel DSC. For example, most of dyes currently having high conversion efficiency of practical use level are ruthenium complex (for example, Japanese Patent No. 3731752 (Patent Document 1)). Since ruthenium is a rare metal, the reserve of which is small, there is a problem as to the resource. Further, there is also a problem of characteristic toxicity of metals as well as a significant problem in cost. To solve these problems, metal-free organic dye is intensively developed worldwide, but the current situation does not reach practical use level as to the conversion efficiency and the durability (for example, Japanese Patent No. 4080288 (Patent Document 2)). Further, most of these high performance organic dyes are yellow through reddish purple. Therefore, development of blue dye with high performance and high durability, which absorbs a longer wavelength region, is strongly requested.

SUMMARY

As described above, the currently reported performance of the metal-free organic dye is not sufficient as to both conversion efficiency and durability. Further, a variation in color necessary to add design characteristics is also insufficient. Therefore, development of novel dye is requested.

Further, sensitization of zinc oxide, which is an excellent electrode material, is known to be remarkably difficult, compared with the aforementioned sensitization of titanium oxide. Even if dyes having high performance for titanium oxide are used for zinc oxide electrodes, most of the dyes do not achieve sufficient performance, and further, they are extremely unstable. Therefore, development of novel organic dye having high performance and high general-purpose characteristics, and which is usable to sensitize electrode materials other than titanium oxide, especially zinc oxide and tin oxide, is strongly requested. Further, use of a plastic substrate instead of a glass substrate is essential to reduce the weight of a DSC. Further, an inorganic electrode material producible by sintering at low temperature and a novel organic dye to be combined with the inorganic electrode material need to be developed.

In view of the aforementioned problems, the present disclosure is directed to providing a photosensitizer (a novel organic dye) for sensitizing a titanium oxide or zinc oxide electrode that has high conversion efficiency, high durability, a wide variation in color and a low cost. Further, the present disclosure is directed to providing a photoelectric conversion device having a light absorption layer including this photosensitizer.

As a result of intensive study, the inventors of the present disclosure have developed a novel dye having an indoline skeleton or a tetrahydroquinoline skeleton in a donor part and an enone structure at an acceptor part, and which is represented by the following general formula (I). They have completed the present disclosure by finding out that a photoelectric conversion device having high conversion efficiency in a wide visible spectral region of reddish purple through bluish green is obtainable by using this novel dye, as a photosensitizer.

Specifically, the photosensitizer of the present disclosure is a dye represented by the following general formula (I) or its salt. More specifically, the photosensitizer of the present disclosure is characterized by having a novel enone structure at an electron acceptor site.

[Chemical 1]

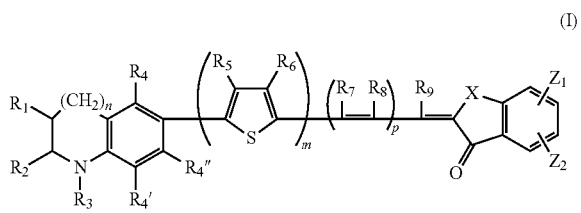

(In formula (I), m represents an integer of 0 through 4, and n represents an integer of 0 or 1, and p represents an integer of 0 to 2. $R_1$ and $R_2$ represent a hydrogen atom, an alkyl group or an aryl group, and may bind to each other to form an aromatic ring or an aliphatic ring. $R_3$ represents an alkyl group, an aryl group, an aralkyl group or a heterocyclic residue. $R_4$, $R_4'$ and $R_4''$ represent a hydrogen atom, an alkyl group, an aralkyl group, an alkoxy group, a substituted amino group or a halogen atom, and may bind at $R_4'$ and $R_4''$ to form a ring structure. $R_5$ and $R_6$ represent a hydrogen atom, an alkyl group, an alkoxy group or an alkylthio group, and may bind at $R_5$ and $R_6$ to form a ring structure. $R_7$, $R_8$ and $R_9$ represent a hydrogen atom, an alkyl group, an aralkyl group, an alkenyl group or an aryl group, and may bind at $R_7$ and $R_8$, or at $R_8$ and $R_9$ to form an aliphatic ring. X represents an oxygen atom, a sulfur atom, an alkylene group, a substituted amino group, a carbonyl group, a sulfonyl group, or an aliphatic spiro ring. $Z_1$ and $Z_2$ represent a hydrogen atom, a hydroxyl group, a carboxyl group, an alkoxycarbonyl group, a sulfone group or a substituted amino group. Here, an acidic group is included as at least one substituent in a molecule).

The photoelectric conversion device of the present disclosure is characterized by having a light absorption layer including a photosensitizer of a dye represented by the above general formula (I) or its salt.

The dye represented by the above general formula (I) or its salt, which is the photosensitizer of the present disclosure, is able to improve photoelectric conversion efficiency, compared with conventionally-known dyes, and also to improve the stability in adsorption of dye. The mechanism of action is not necessarily clear, but it is conceivable that an improvement in the efficiency of photoelectron transport by an efficient push-pull action of π electrons between the donor part of the indoline skeleton or the tetrahydroquinoline skeleton and the acceptor part of the novel enone structure has influenced the high conversion efficiency.

Further, the photosensitizer of the present disclosure is advantageous also in that an effect of absorbing longer wavelengths by introduction of a longer linker than existing dyes is extremely high, and that a fine adjustment of hue by a substituent is possible. Further, since conventional blue dyes are cationic acceptors given by quaternerization of nitrogen in indolenine, benzothiazole and the like, they are strongly affected by oxygen in air. In contrast, the dye of the present disclosure is a non-ionic compound, the oxidation electric potential of which is high. It is conceivable that the durability has remarkably improved as the dye is less subject to decomposition by oxidation in air. A molar light absorption coefficient has increased by enhancement of a push-pull effect by introduction of this conjugate structure, and it is also possible to absorb longer wavelengths at the same time. Therefore, an optimum photosensitizer for a photoelectric conversion device is achievable.

Further, conversion efficiency of practical use level is achievable by using the photosensitizer of the present disclosure as a light absorption layer of a photoelectric conversion device. The photosensitizer of the present disclosure is able to improve the photoelectric conversion efficiency in a wide range of wavelength region, and to achieve an especially excellent effect in a dye-sensitized solar cell the design characteristics of which are emphasized.

BRIEF DESCRIPTION OF THE DRAWING

FIG. 1 is a schematic block diagram illustrating an embodiment of a photoelectric conversion device according to the present disclosure.

DETAILED DESCRIPTION OF THE PREFERRED EMBODIMENTS

Next, a photosensitizer of the present disclosure will be described in details.

[Chemical 1]

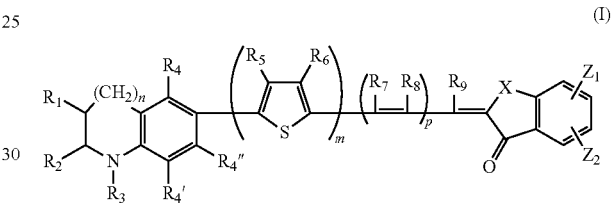

In general formula (I), m represents an integer of 0 through 4, and n represents an integer of 0 or 1, and p represents an integer of 0 to 2.

A compound represented by the aforementioned general formula (I) of the photosensitizer of the present disclosure may be a free acid represented by the general formula (I) or its salt. Salts of the compound represented by the general formula (I) are, for example, an alkali metal salt or alkali earth metal salt, such as carboxylic acid lithium, sodium, potassium, magnesium and calcium, or an alkylammonium salt, such as tetramethylammonium, tetrabutylammonium, pyridinium, piperidinium and imidazolium.

In the general formula (I), $R_1$ and $R_2$ represent a hydrogen atom, an alkyl group or an aryl group. Examples of the alkyl group are normal alkyl groups, such as a methyl group, an ethyl group and a propyl group, branched alkyl groups, such as an isopropyl group and an isobutyl group, and cyclic alkyl groups, such as a cyclopentyl group and a cyclohexyl group, and these alkyl groups may be further substituted by substituents that will be described later. Examples of the aryl group are phenyl, naphthyl, anthranil, phenanthrenyl, pyrenyl, indenyl, azulenyl and fluorenyl groups, and they may further have substituents. $R_1$ and $R_2$ may bind to each other to form an aromatic ring or an aliphatic ring. A ring structure formed in that case is, for example, benzene, naphthalene, cyclopentane, cyclopentanone, pyridine, piperidine, piperazine, pyrazole, pyrrole, imidazole, thiazole, indole, quinoline, carbazole and the like, and they may further have substituents, or further have ring structures as substituents.

Examples of the substituent are a cyano group, an isocyano group, thiocyanato group, an isothiocyanato group, a nitro group, a nitrosyl group, a sulfo group, a halogen atom, a hydroxyl group, a phosphate group, an organophosphate group, a substituted or unsubstituted mercapto group, a substituted or unsubstituted amino group, a substituted or unsubstituted amide group, an alkoxy group, an alkoxyalkyl group, a carboxyl group, an alkoxycarbonyl group, an alkyl group, an aryl group, an acyl group, and the like, but not particularly limited.

Specifically, as the acyl group, for example, an alkylcarbonyl group and an arylcarbonyl group having a carbon number of 1 to 10 are desirable. Examples of the halogen atom are atoms of chlorine, bromine, iodine and the like. Examples of the organophosphate group are an alkyl phosphate (C1-C4) ester group and the like. Examples of the substituted mercapto group are alkylthio groups, such as methylthio and ethylthio, and the like.

Examples of the substituted amino group are a mono- or di-alkylamino group, a mono- or di-arylamino group and the like, and specifically, a mono- or di-methylamino group, a mono- or di-ethylamino group, a mono- or di-propylamino group, a mono-phenylamino group, a benzylamino group and the like. Examples of the substituted amide group are an alkylamide group, an aromatic amide group and the like. Examples of the alkoxy group are an alkoxy group having a carbon number of 1 to 10, and the like. Examples of an alkoxyalkyl group are a (C1-C10) alkoxy (C1-C4) alkyl group, such as an ethoxyethyl group, and the like.

Examples of the alkoxycarbonyl group are an alkoxycarbonyl group having a carbon number of 1 to 10, such as an ethoxycarbonyl group, and the like. Further, an acidic group, such as a carboxyl group, a sulfo group and a phosphate group, may form an organic salt like a salt of metal, such as lithium, sodium, potassium, magnesium and calcium, and an ammonium salt, such as tetramethylammonium, tetrabutylammonium, pyridinium, piperidinium and imidazolium.

$R_3$ represents an alkyl group, an aryl group, an aralkyl group or a heterocyclic residue, and examples of the alkyl group and the aryl group are similar to the aforementioned examples. The aralkyl group means an alkyl group substituted by an aryl group as will be described later. Examples of the aralkyl group are a benzyl group, a phenylethyl group, a methylnaphthyl group and the like, and they may further have substituents. The heterocyclic residue means a group given by removal a hydrogen atom from a heterocyclic compound, and examples of the heterocyclic residue are pyridyl, pyradyl, piperidyl, pyrazolyl, morpholyl, indolinyl, thiophenyl, furyl, oxazolyl, thiazolyl, indolyl, benzothiazolyl, benzoxazolyl, quinolyl, rhodanile and the like, and they may further have substituents.

In the general formula (I), $R_4$, $R_4'$ and $R_4''$ represent a hydrogen atom, an alkyl group, an aralkyl group, an alkoxy group, a substituted amino group or a halogen atom, examples of which are similar to the aforementioned examples. $R_4'$ and $R_4''$ may bind to each other to form a ring structure, examples of which are similar to the aforementioned examples.

In the general formula (I), $R_5$ and $R_6$ represent a hydrogen atom, an alkyl group, an alkoxy group or an alkylthio group, examples of which are similar to the aforementioned examples. $R_5$ and $R_6$ may bind to each other to form a ring structure, examples of which are similar to the aforementioned examples.

In the general formula (I), $R_7$, $R_8$ and $R_9$ represent a hydrogen atom, an alkyl group, an aralkyl group, an alkenyl group or an aryl group, and examples of the alkyl group, the aralkyl group and the aryl group are similar to the aforementioned examples. Examples of the alkenyl group are a vinyl group and an allyl group, and they may further have substituents, and examples of which are similar to the aforementioned examples. $R_7$ and $R_8$, or $R_8$ and $R_9$ may bind to each other to form an aliphatic ring, examples of which are similar to the aforementioned examples.

In the general formula (I), X represents an oxygen atom, a sulfur atom, an alkylene group, a substituted amino group, a carbonyl group, a sulfonyl group, or an aliphatic spiro ring. Examples of the alkylene group are a dimethylmethylene group, a dibutylmethylene group and the like. Examples of the aliphatic spiro ring are cyclopentane, cyclohexane, cyclohexene, cyclohexadiene and the like, and they may further have substituents.

In the general formula (I), $Z_1$ and $Z_2$ represent a hydrogen atom, a hydroxyl group, a carboxyl group, an alkoxycarbonyl group, a sulfone group or a substituted amino group, examples of which are similar to the aforementioned examples.

The compound represented by the general formula (I) includes an acidic group as at least one substituent in a molecule. It is desirable that the acidic group is one of a carboxy group, a sulfonic acid group, a phosphonyl group and a phosphoryl group and salts thereof. The acidic group may bind through a linking group, desirable examples of which are a carboxyvinylene group, a dicarboxyvinylene group, a cyanocarboxyvinylene group, a carboxyphenyl group and the like.

The compound represented by the general formula (I) may form E- and Z-geometric isomers at conjugate chain sites, and an optical isomer at 3a site of an indoline skeleton or a tetrahydroquinoline skeleton. Any of them has an effect as a photosensitizer, and is usable as the dye of the present disclosure.

Next, specific examples of the compound represented by the general formula (I) will be shown, but naturally, the present disclosure is not limited to the examples.

[Chemical 2]

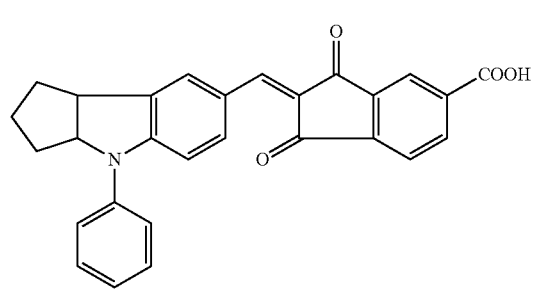

I-01

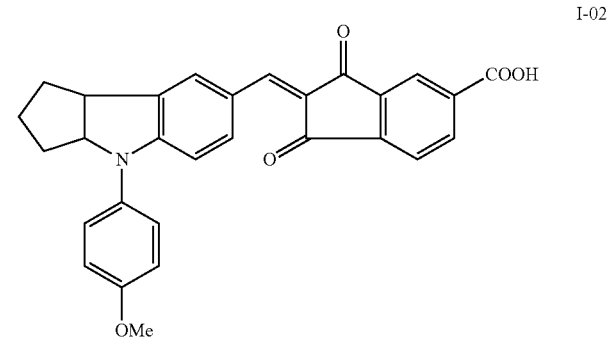

I-02

-continued
I-03
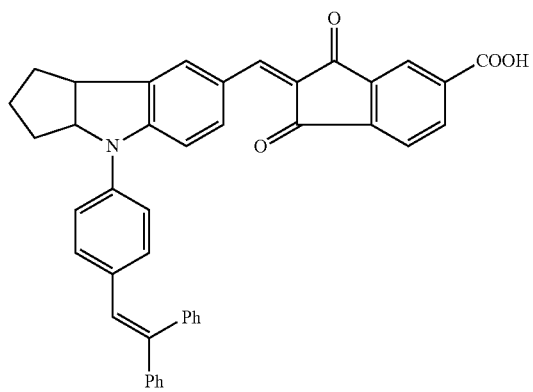
I-04
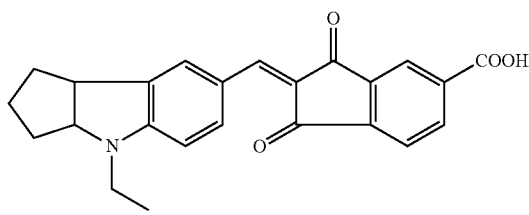
I-05
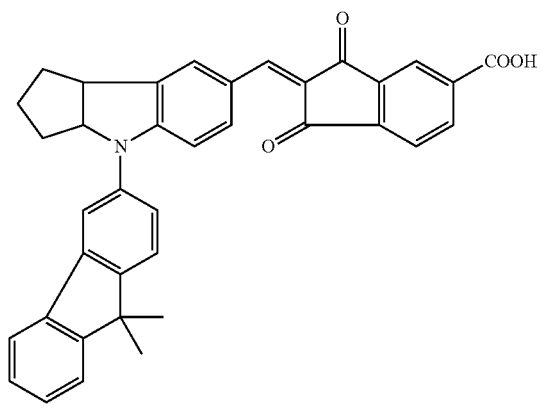
I-06
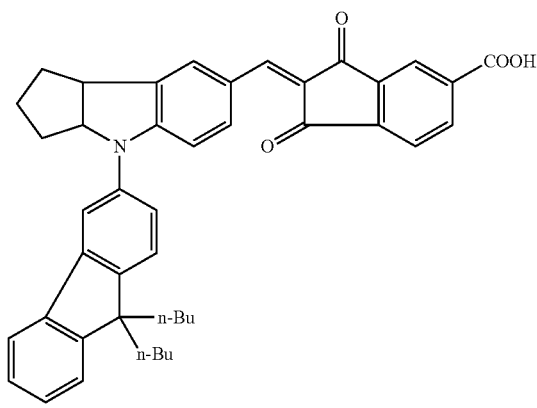
I-07
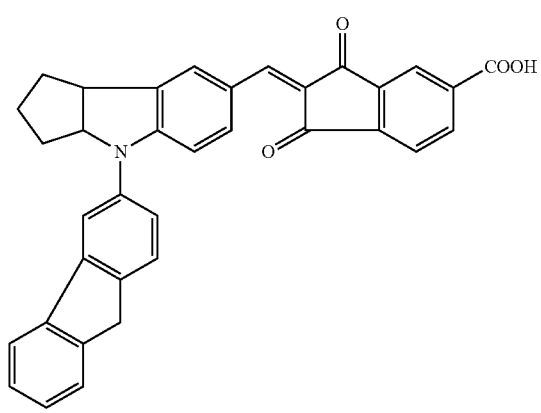
I-08
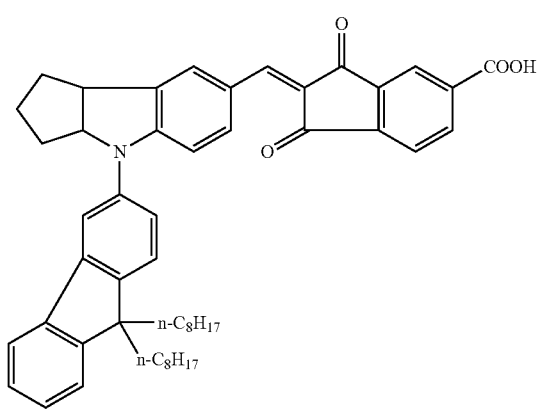
I-09
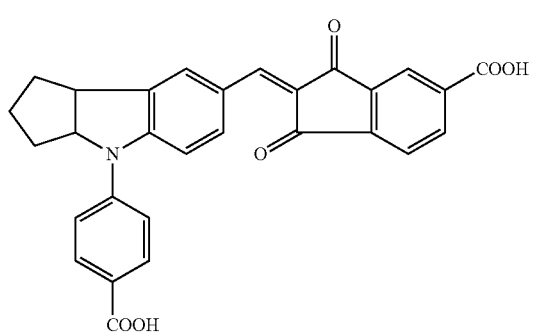
I-10
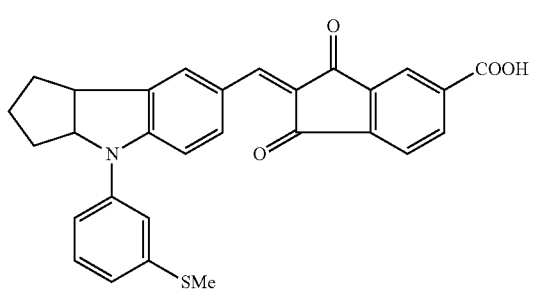

-continued
[Chemical 3]
I-11
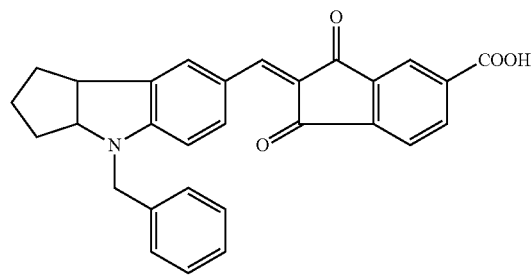
I-12
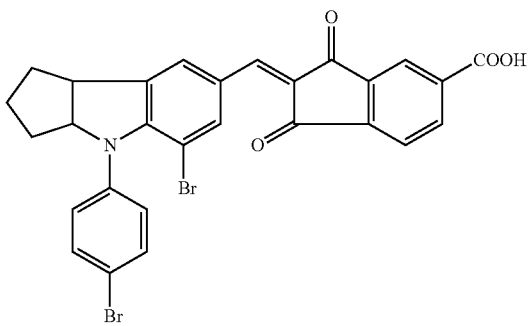
I-13
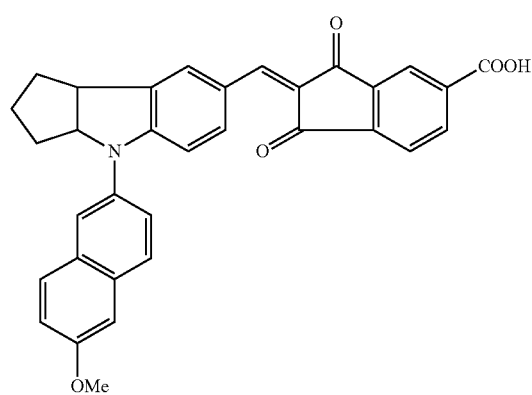
I-14
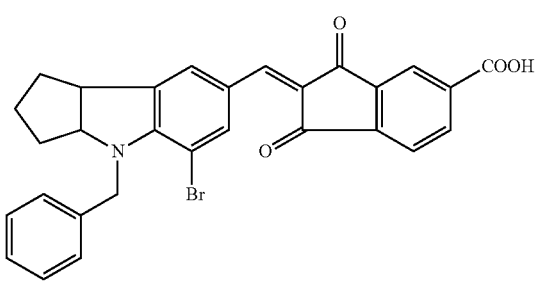
I-15
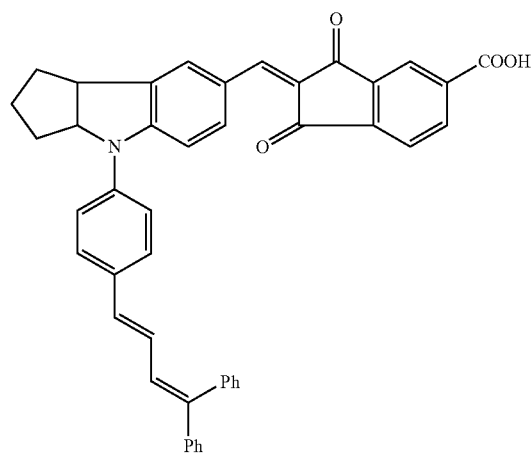
I-16
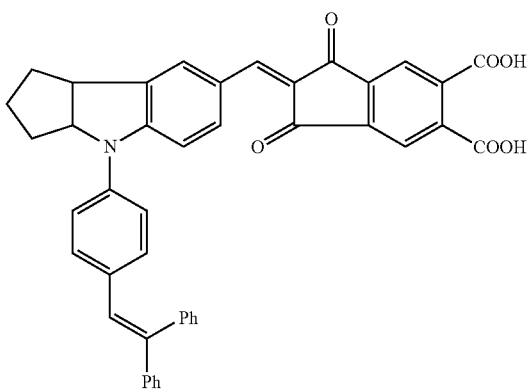
I-17
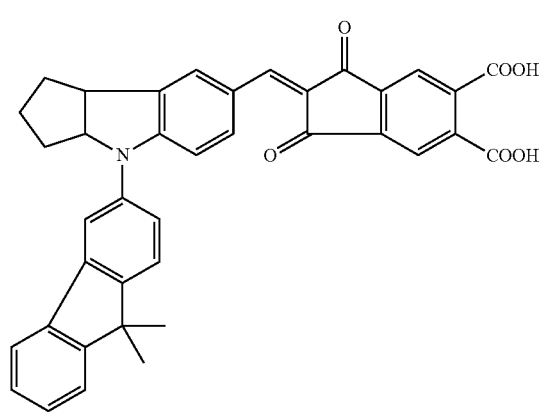
I-18
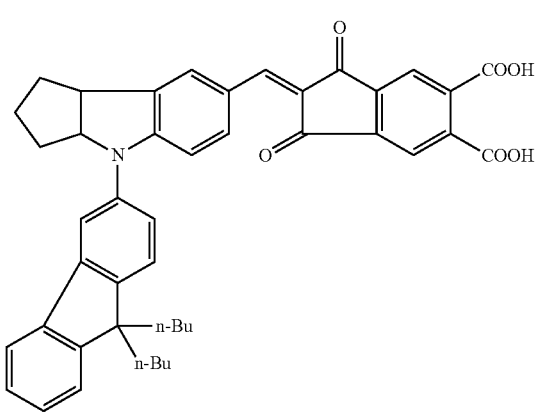

-continued
I-19
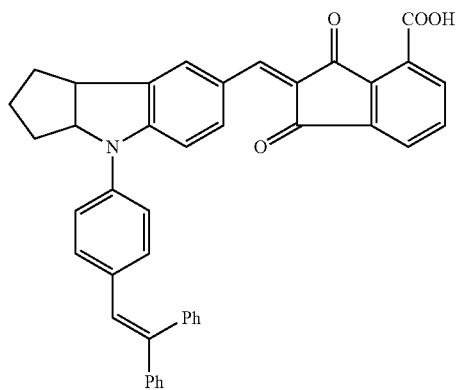
I-20
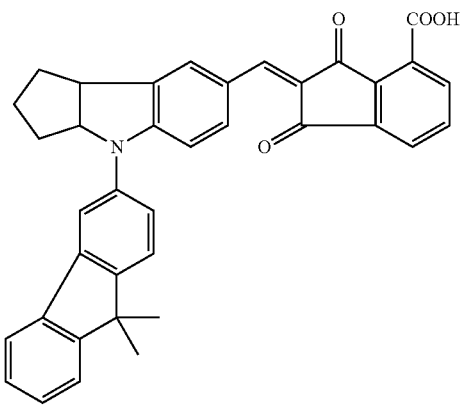
[Chemical 4]
I-21
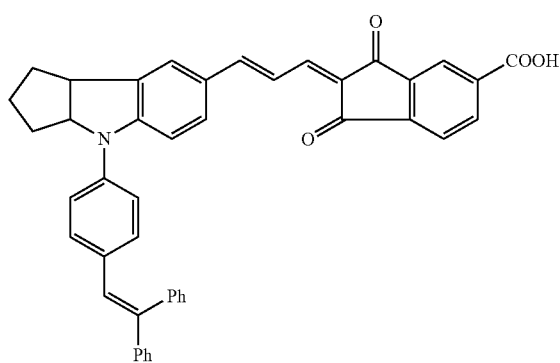
I-22
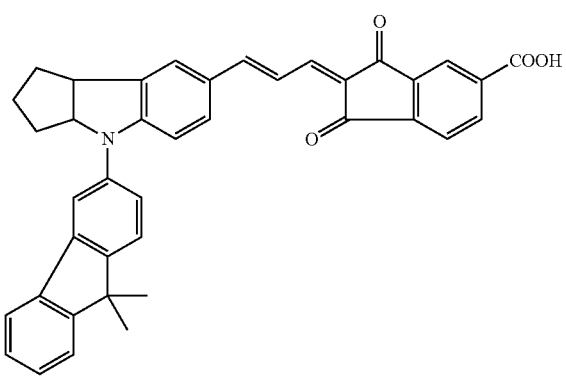
I-23
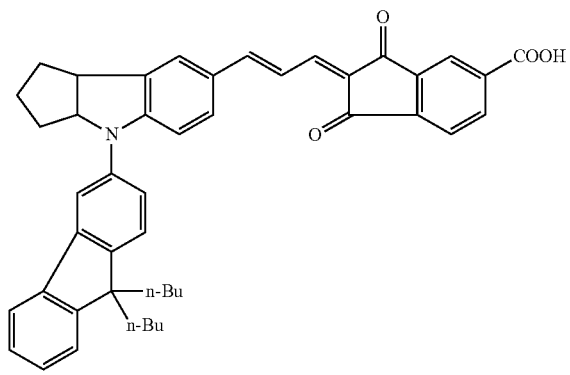
I-24
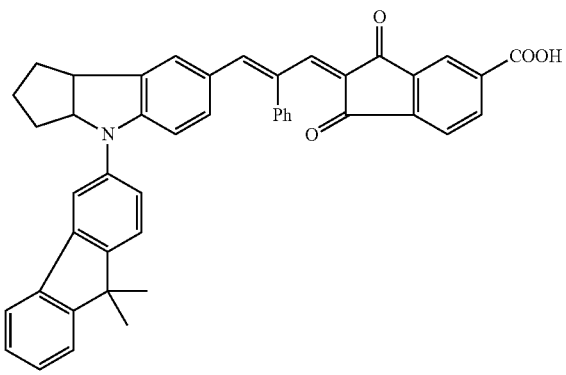
I-25
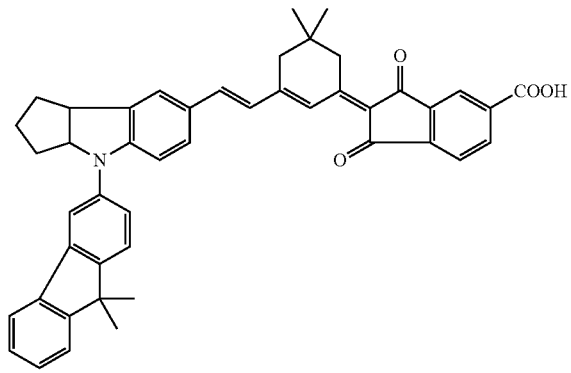
I-26
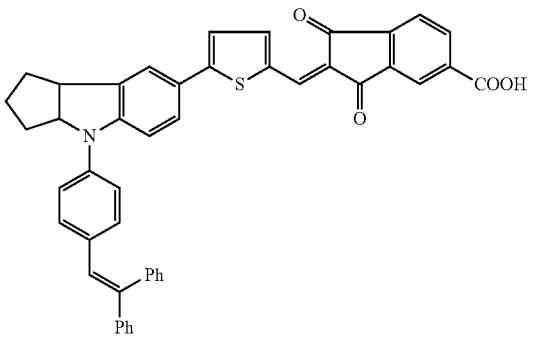

-continued
I-27
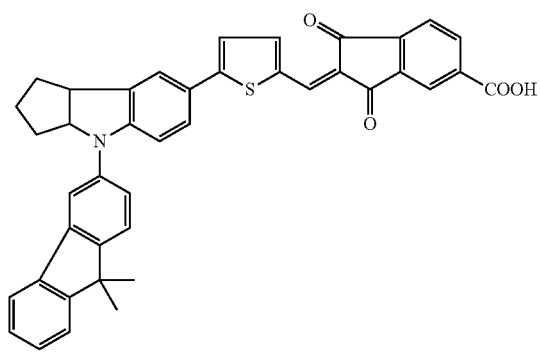
I-28
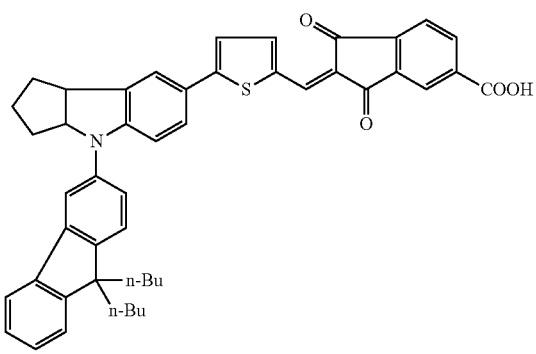
I-29
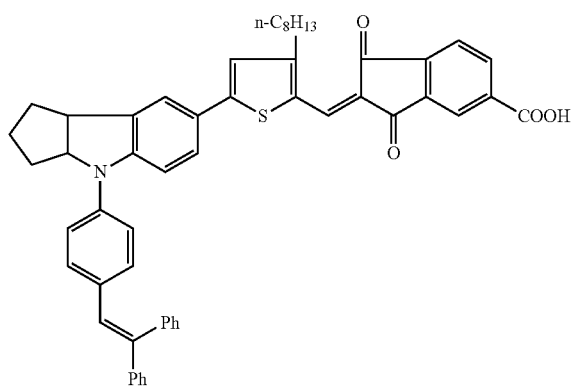
I-30
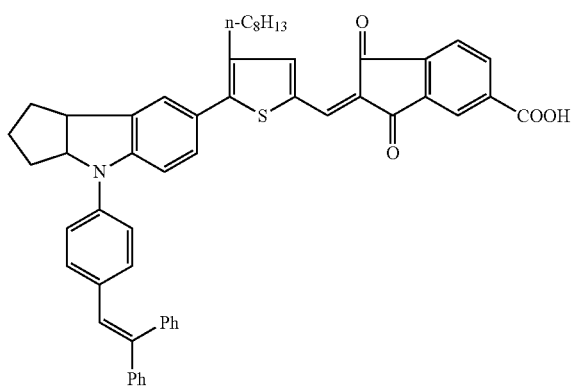
[Chemical 5]
I-31
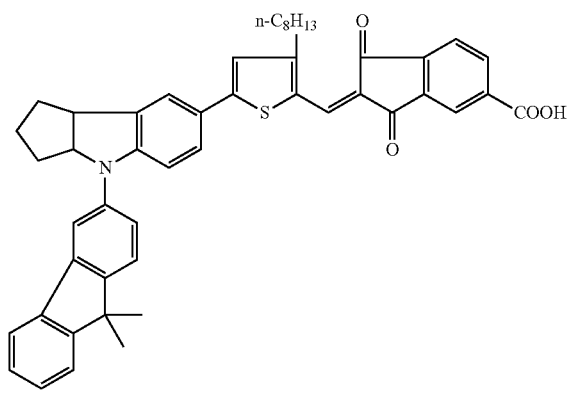
I-32
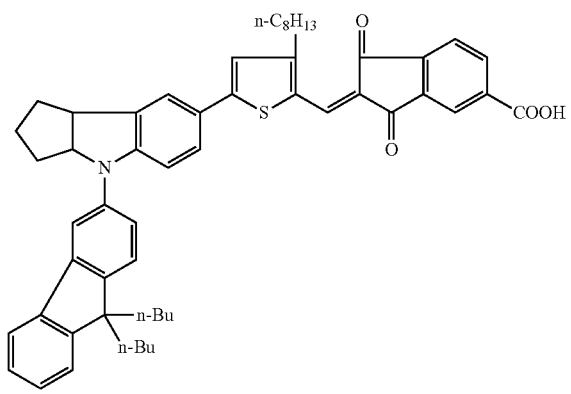
I-33
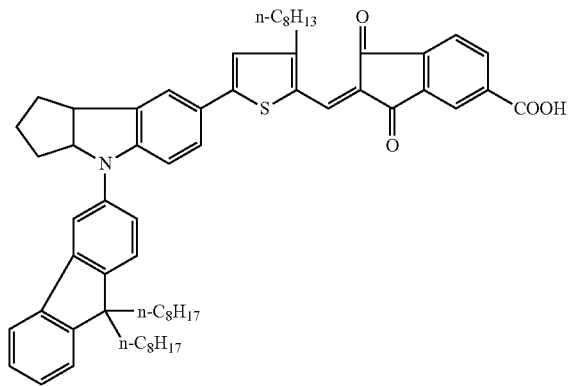
I-34
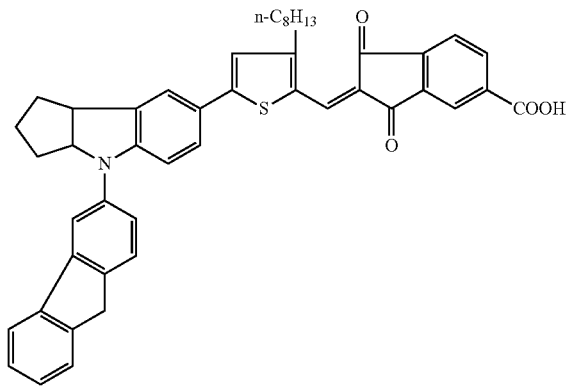

-continued
I-35
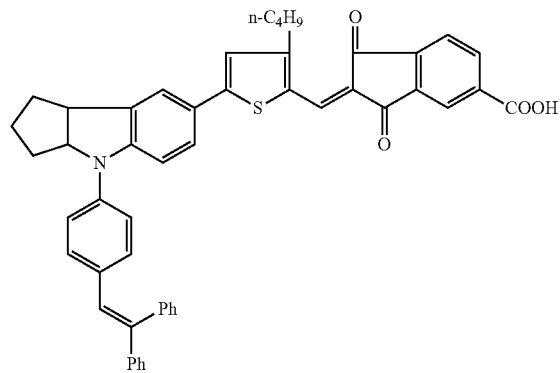
I-36
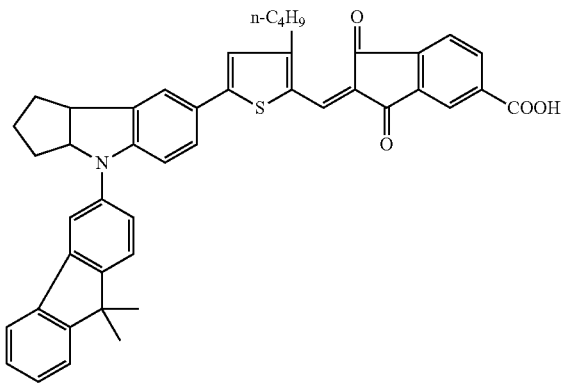
I-37
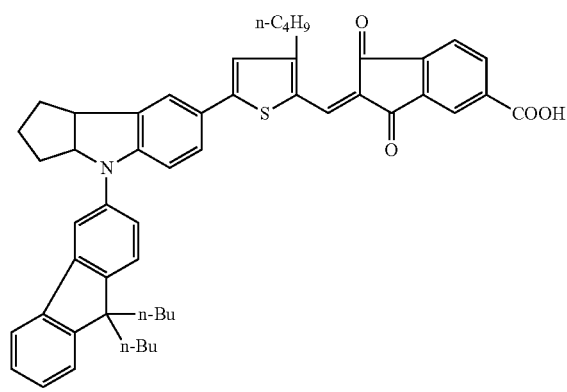
I-38
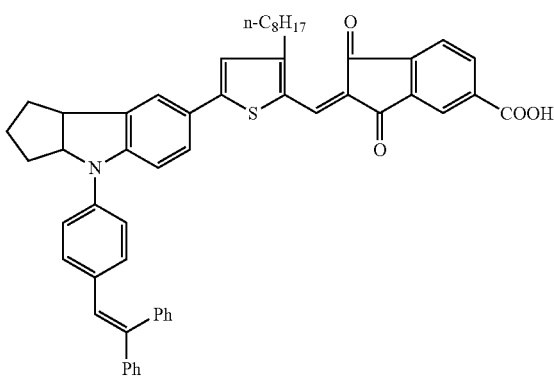
I-39
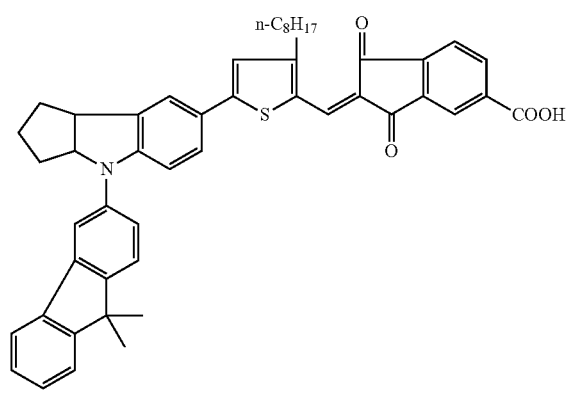
I-40
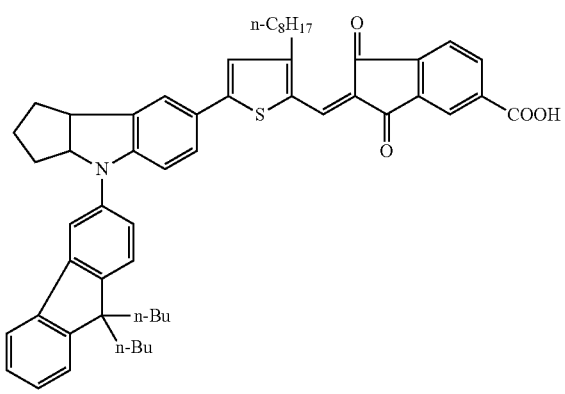

-continued
[Chemical 6]
I-41
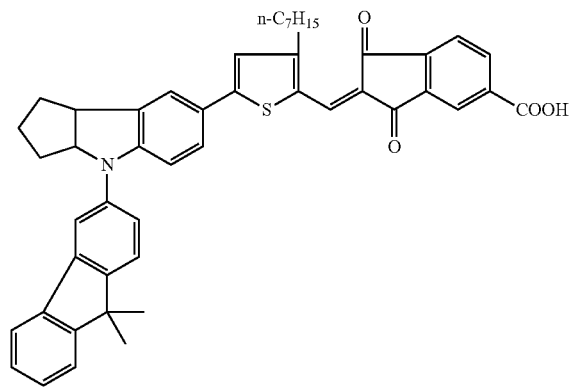
I-42
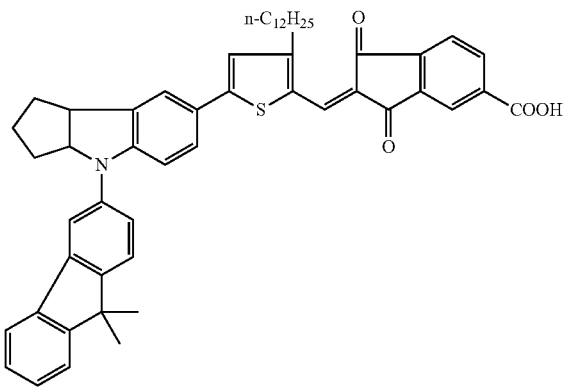
I-43
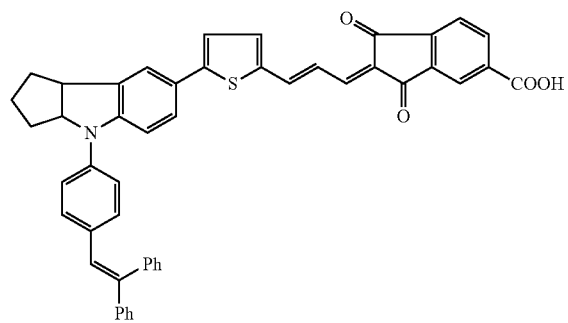
I-44
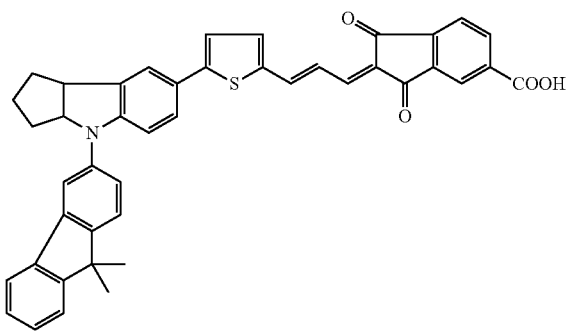
I-45
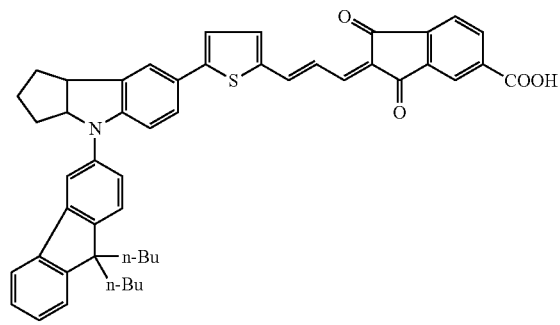
I-46
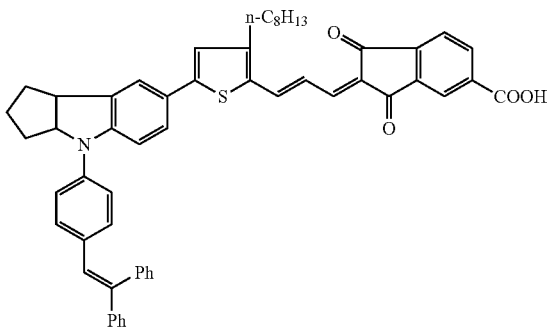
I-47
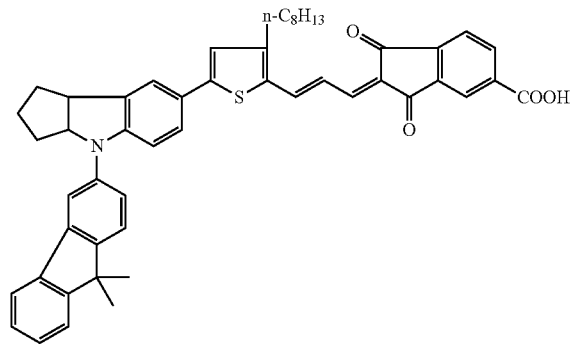
I-48
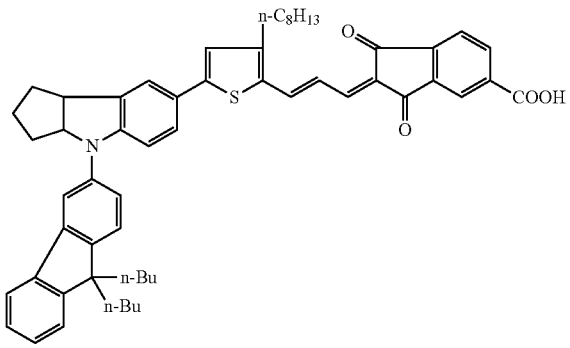

-continued
I-49
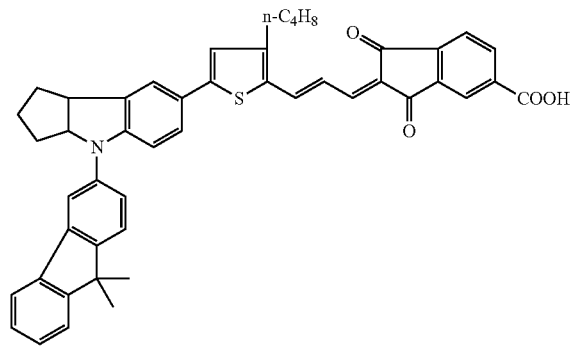
I-50
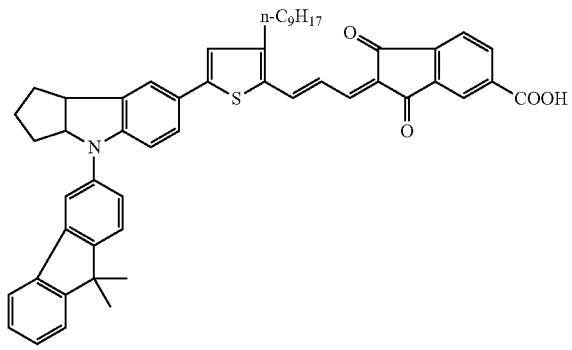
[Chemical 7]
I-51
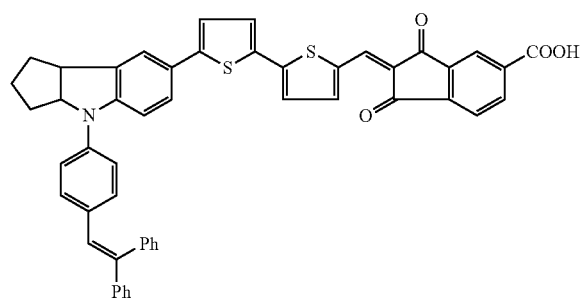
I-52
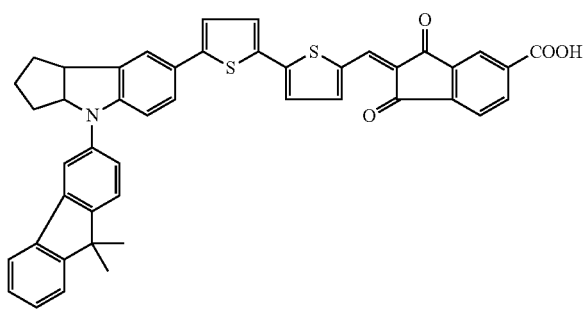
I-53
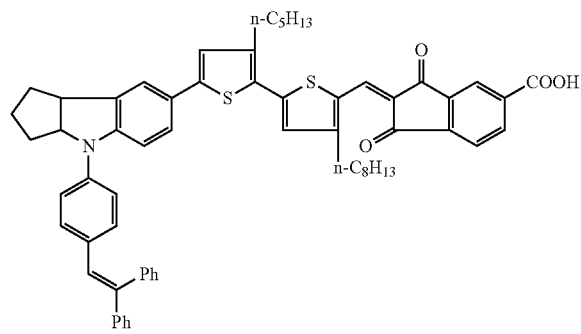
I-54
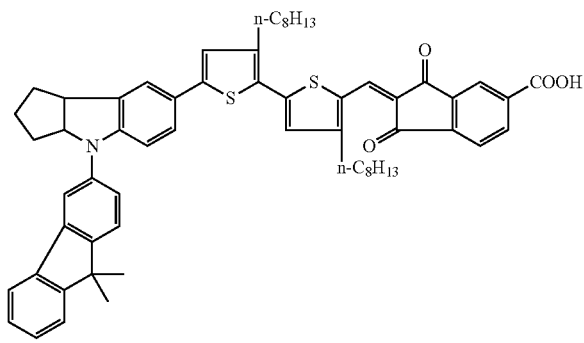
I-55
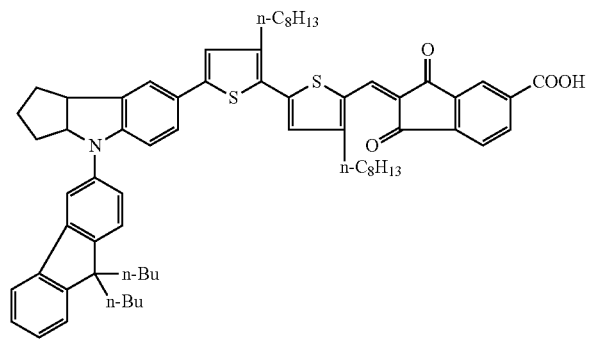
I-56
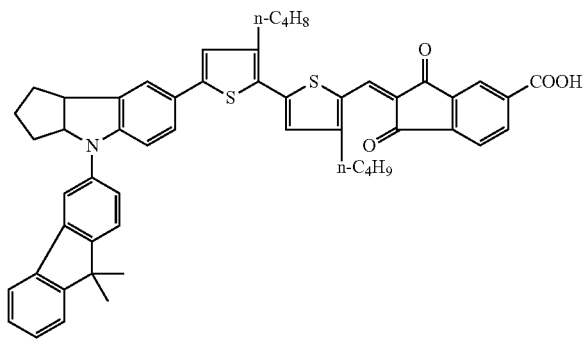

-continued
I-57
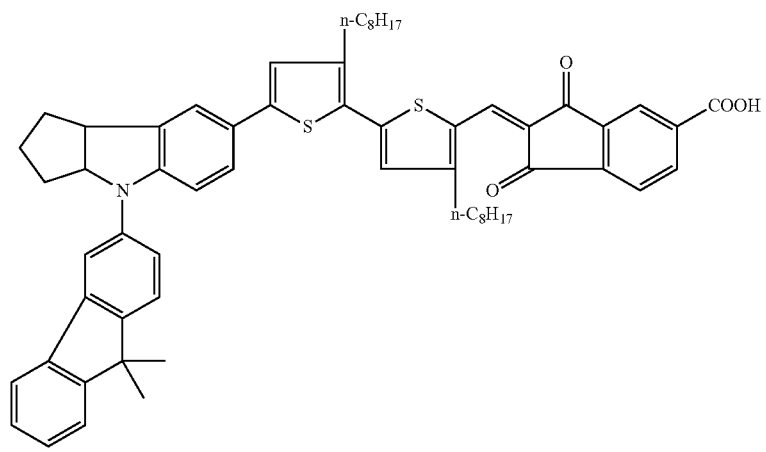
I-58
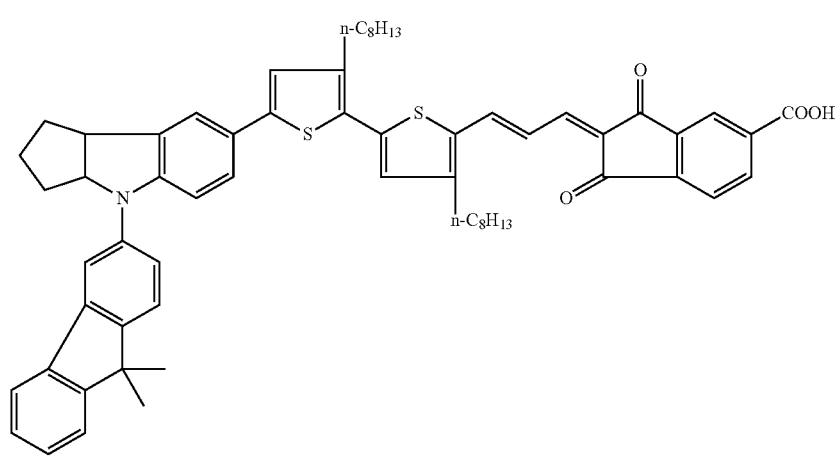
I-59
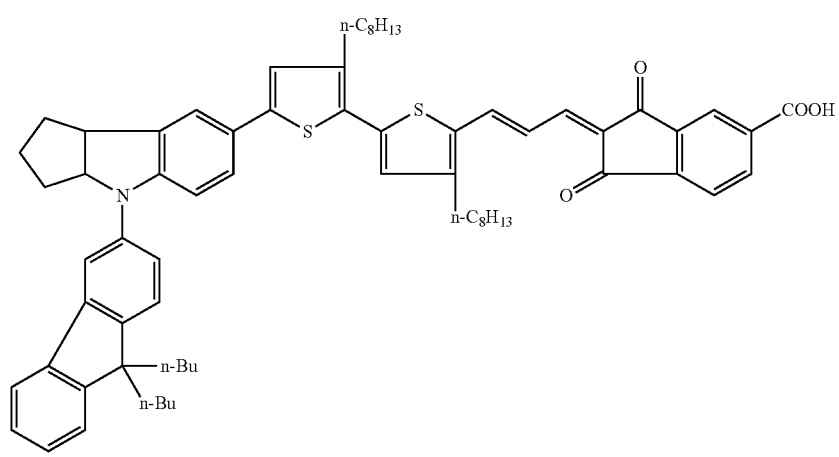

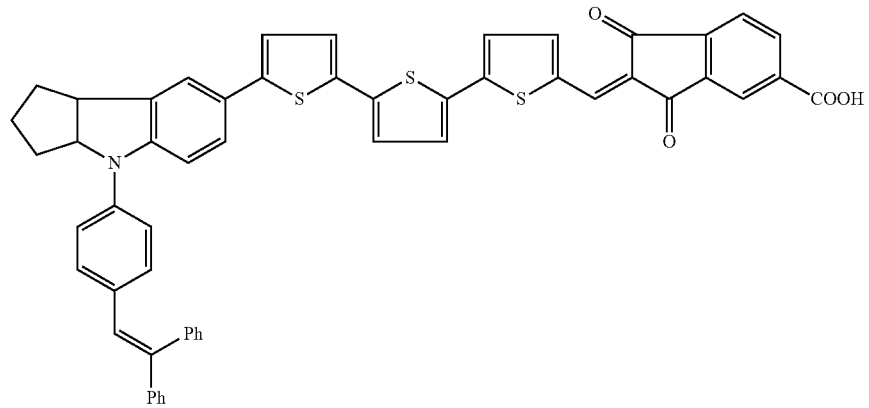
I-60
[Chemical 8]
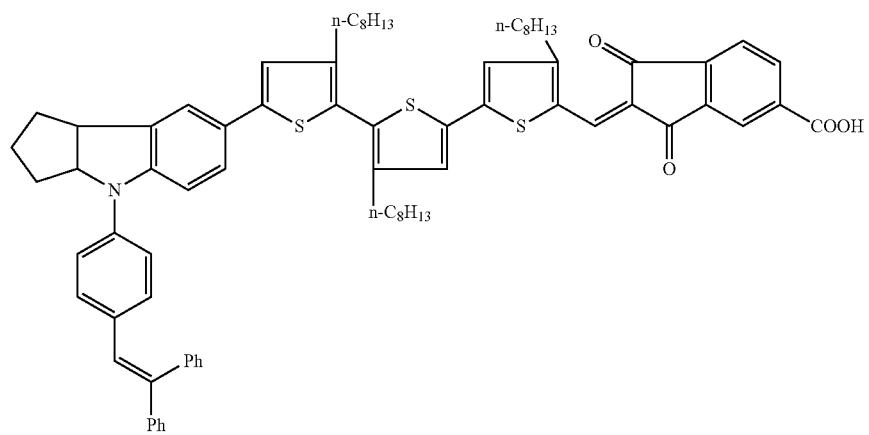
I-61
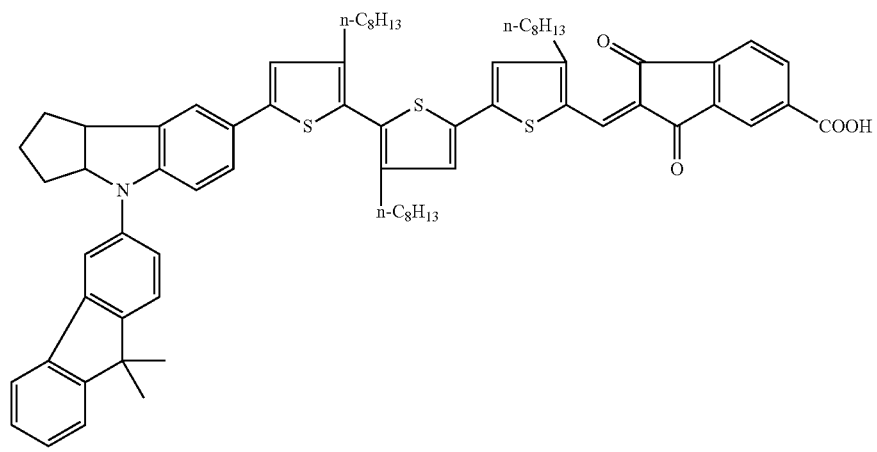
I-62

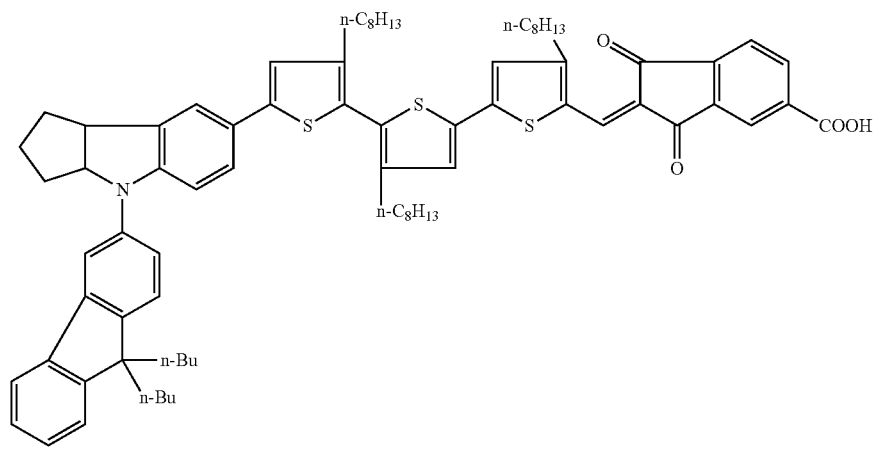
I-63
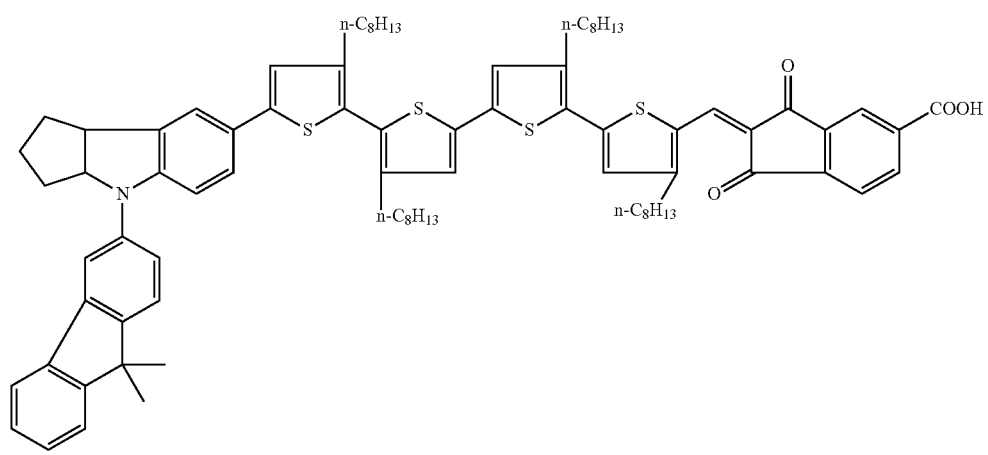
I-64
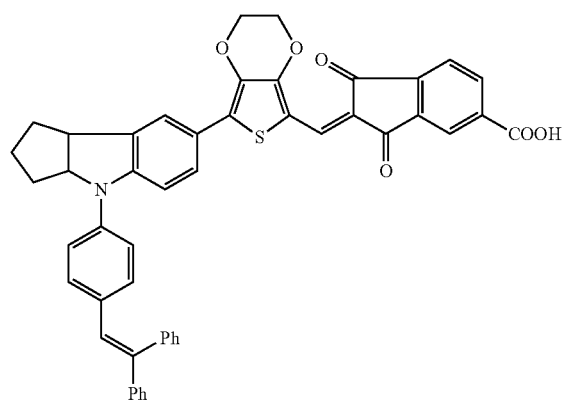
I-65
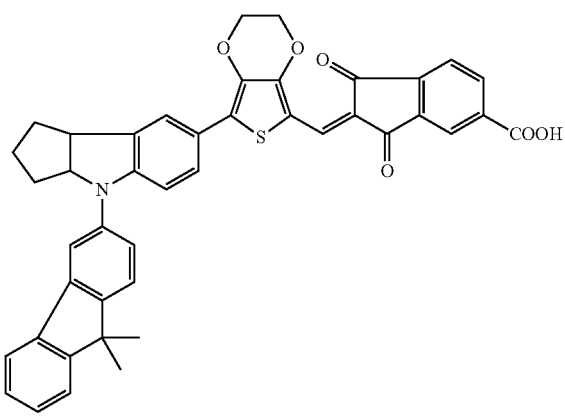
I-66

-continued
I-67
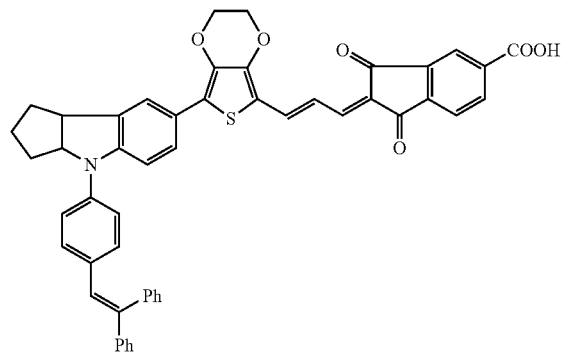
I-68
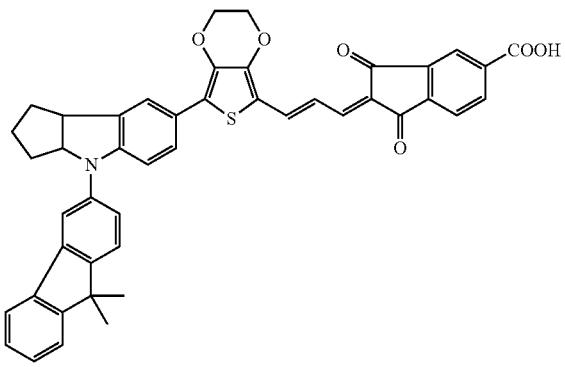
I-69
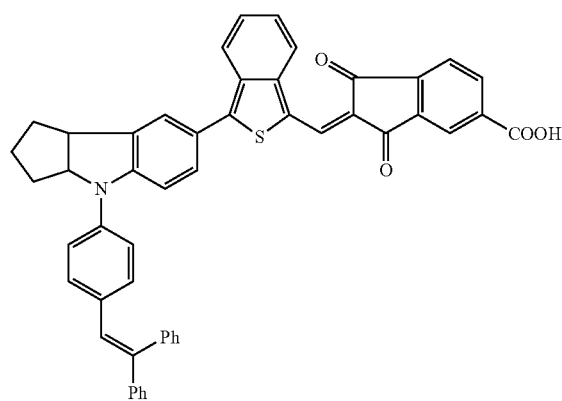
I-70
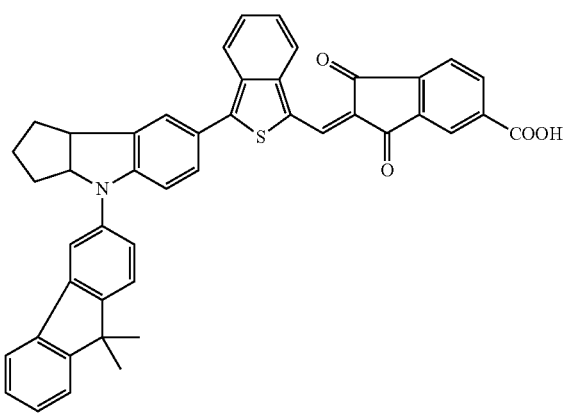
[Chemical 9]
I-71
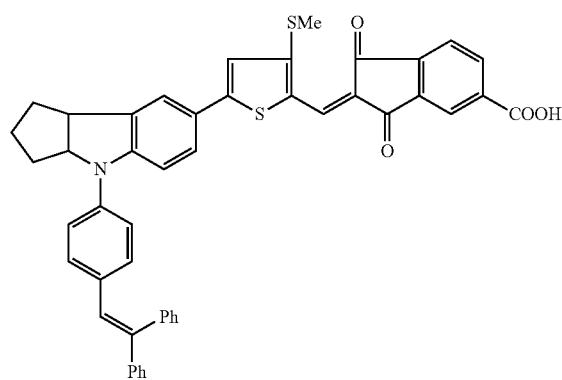
I-72
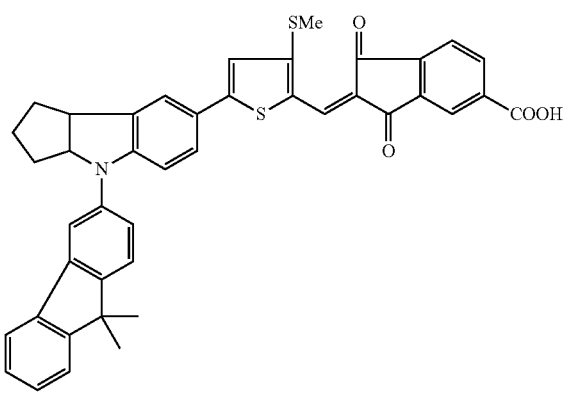

-continued
I-73
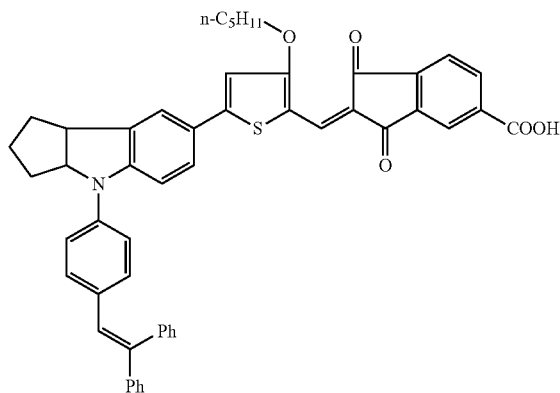
I-74
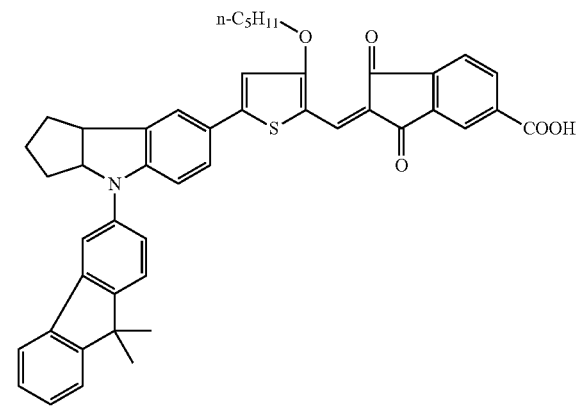
I-75
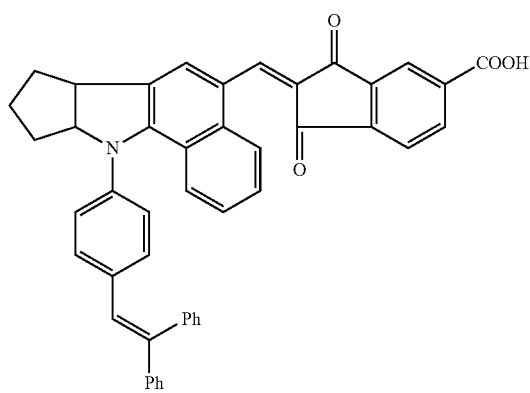
I-76
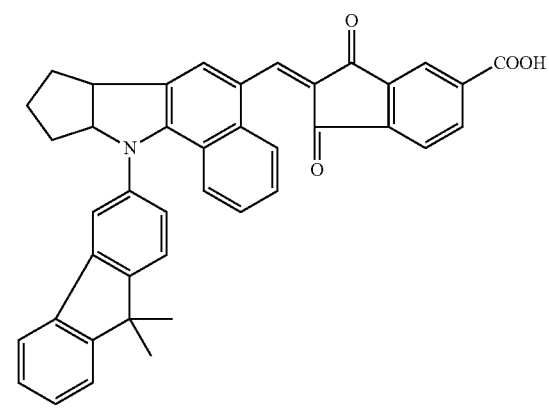
I-77
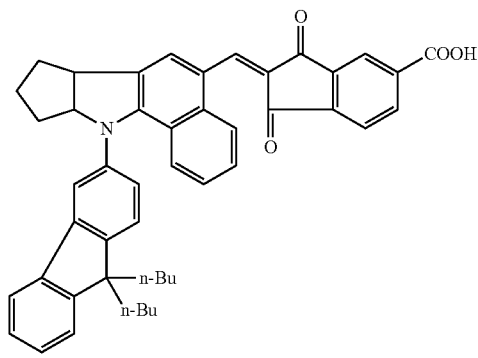
I-78
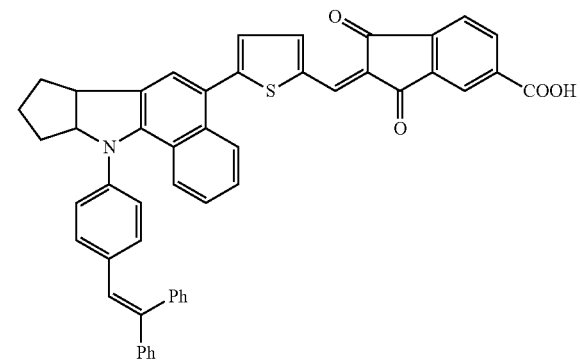
I-79
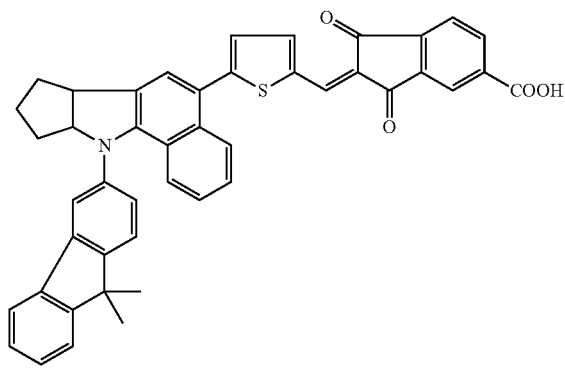
I-80
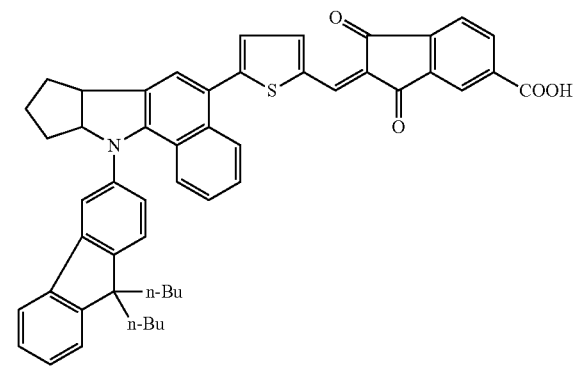

-continued
[Chemical 10]
I-81
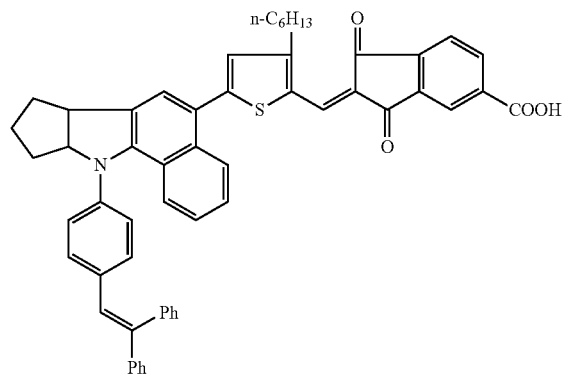
I-82
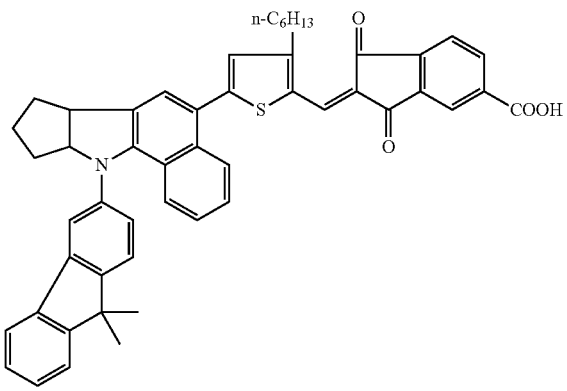
I-83
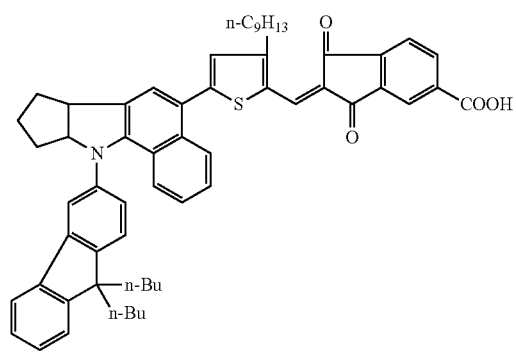
I-84
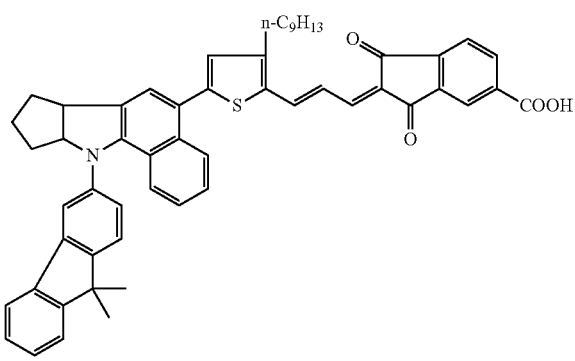
I-85
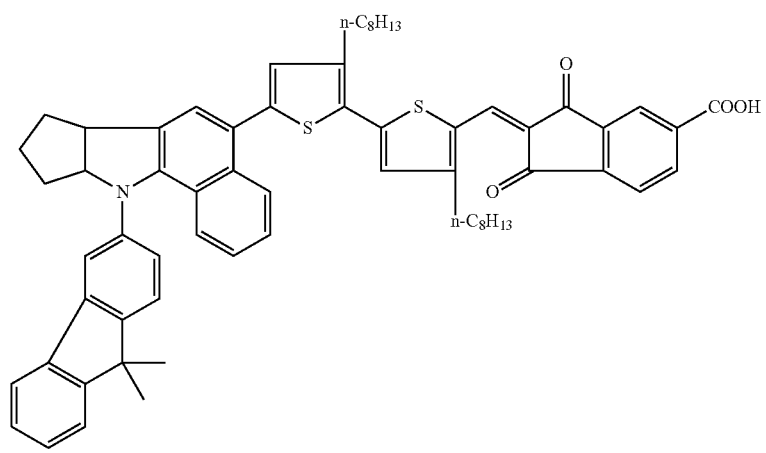

-continued
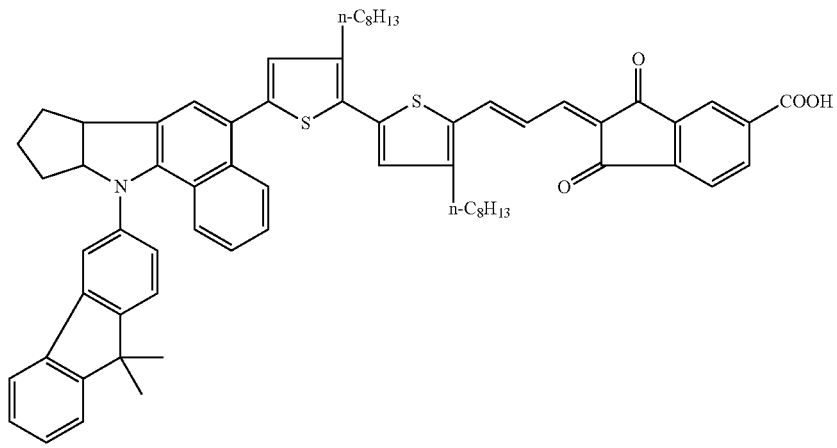
I-86
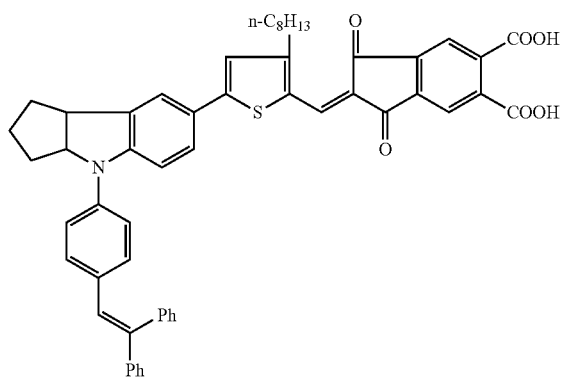
I-87
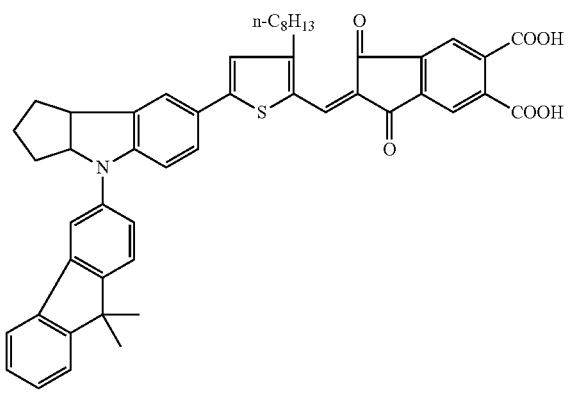
I-88
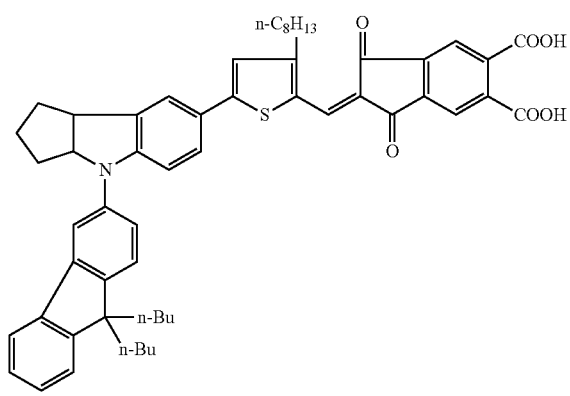
I-89
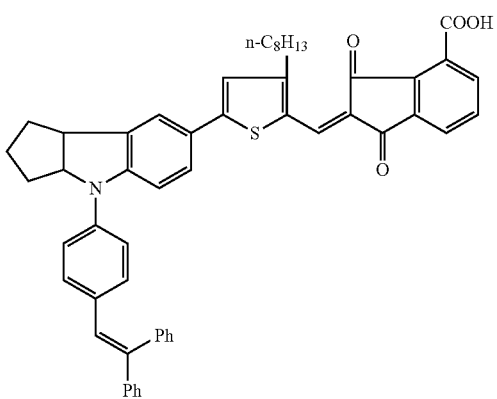
I-90

[Chemical 11]
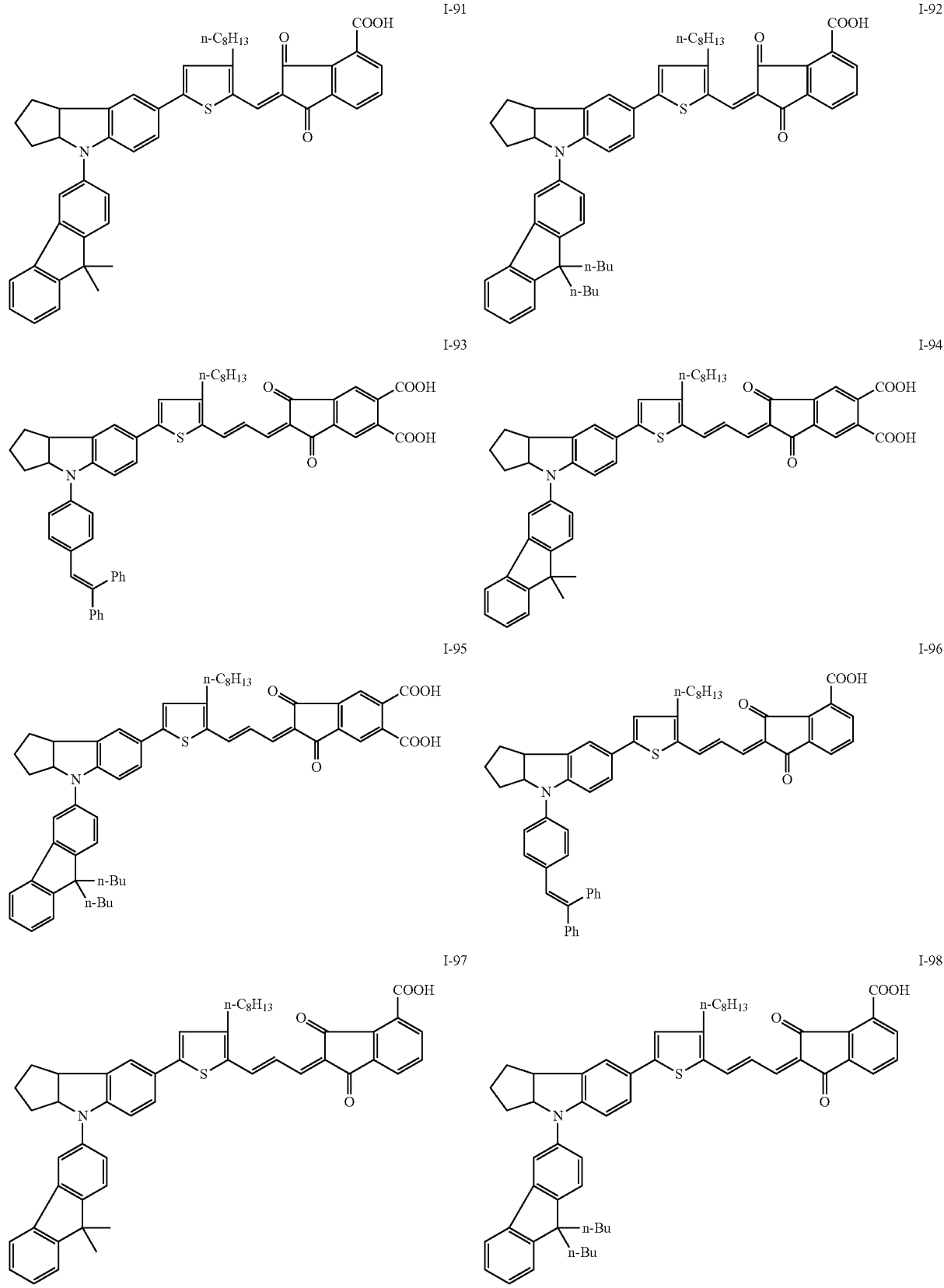

-continued
I-99
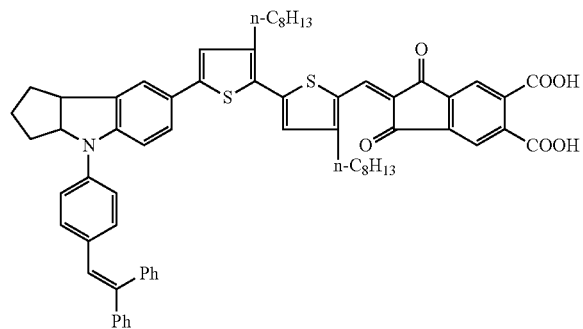
I-100
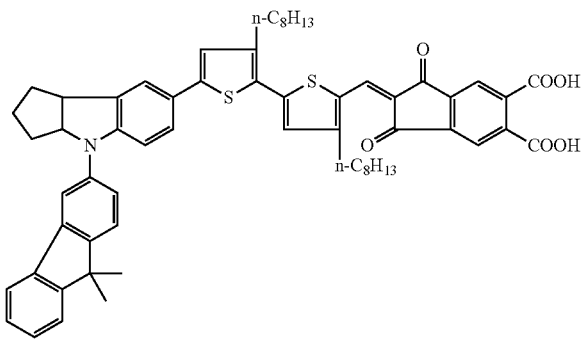
[Chemical 12]
I-101
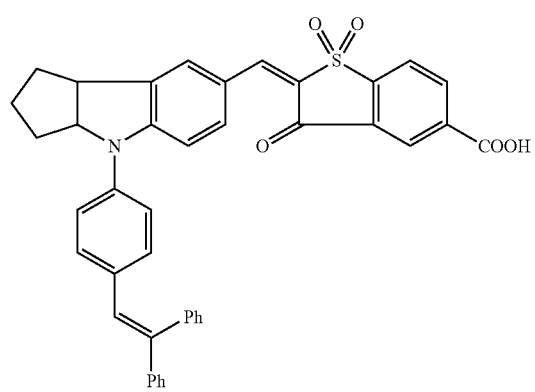
I-102
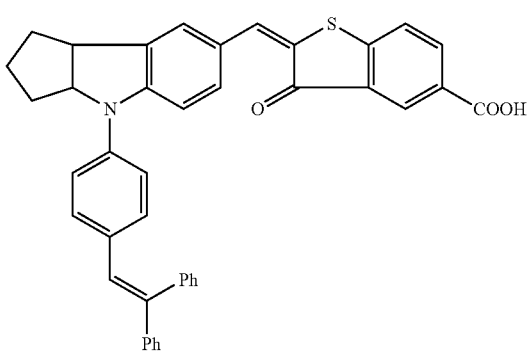
I-103
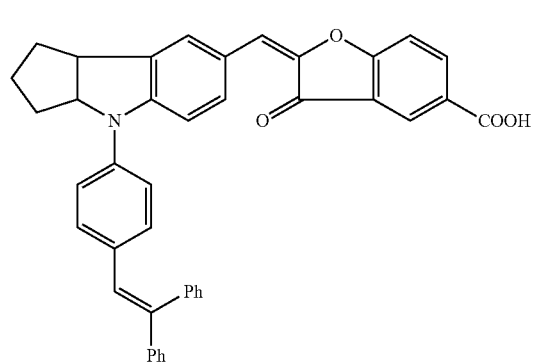
I-104
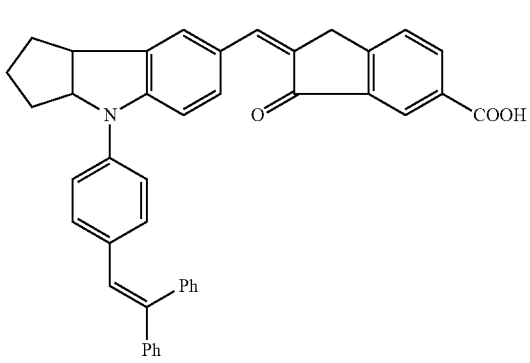
I-105
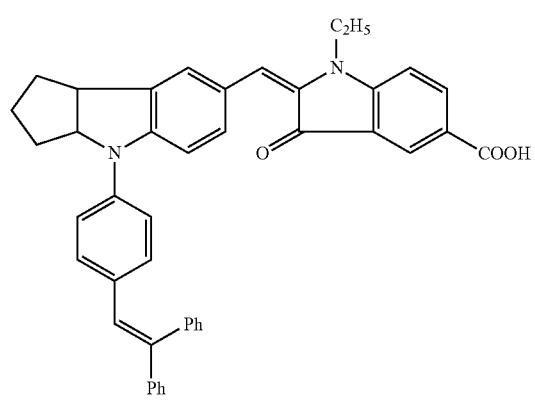
I-106
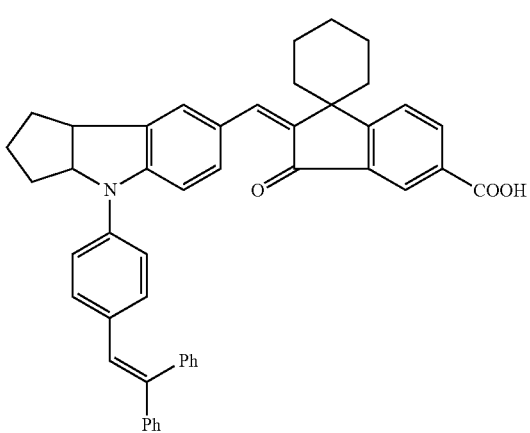

-continued
I-107
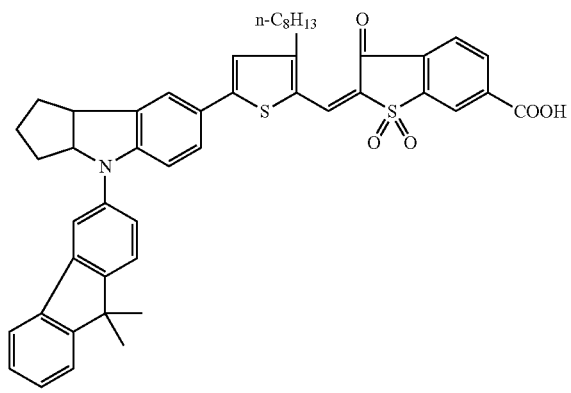
I-108
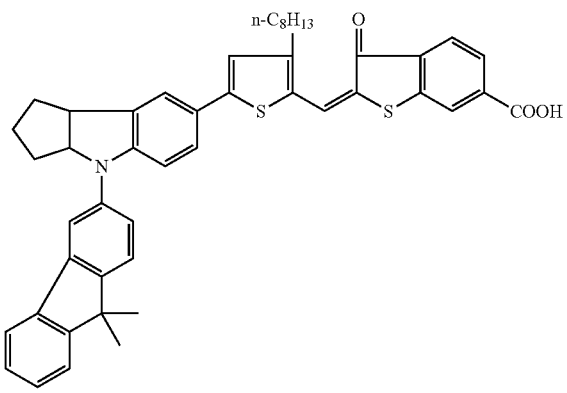
I-109
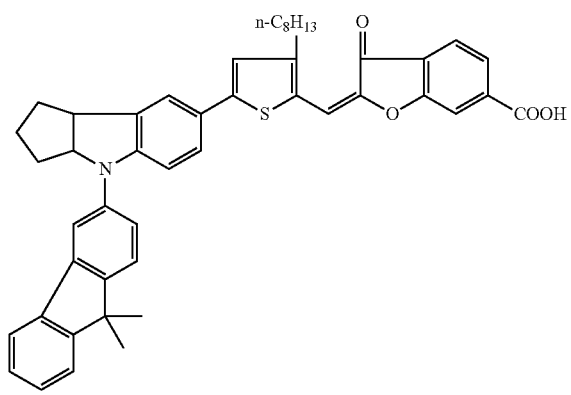
I-110
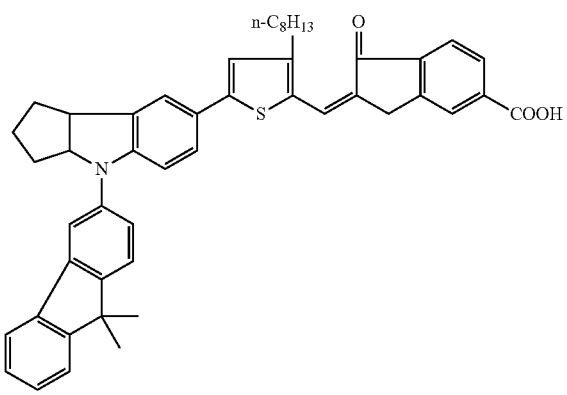
[Chemical 13]
I-111
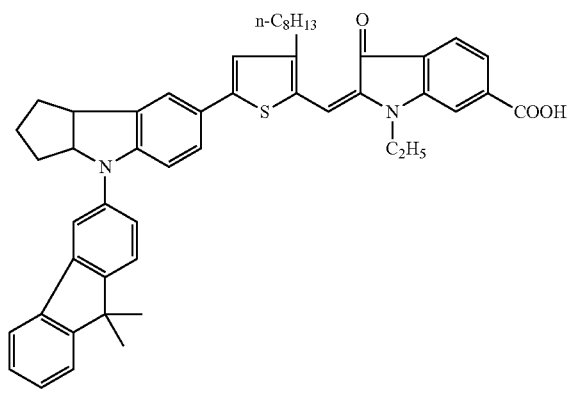
I-112
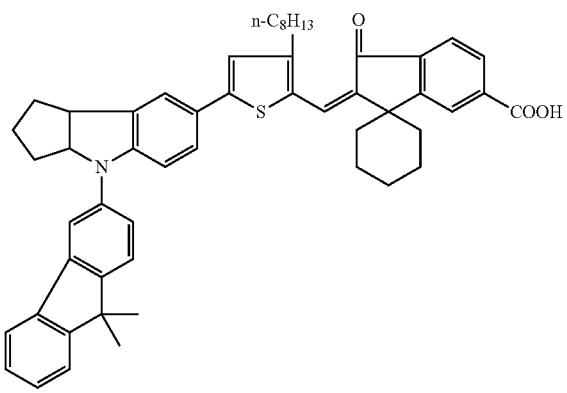
I-113
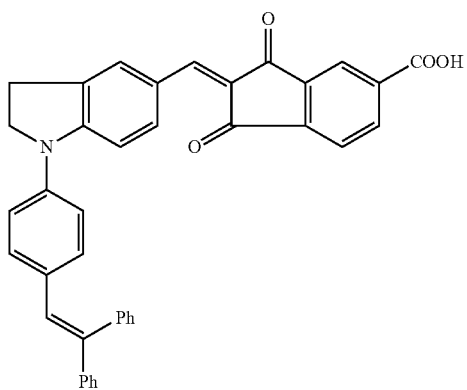
I-114
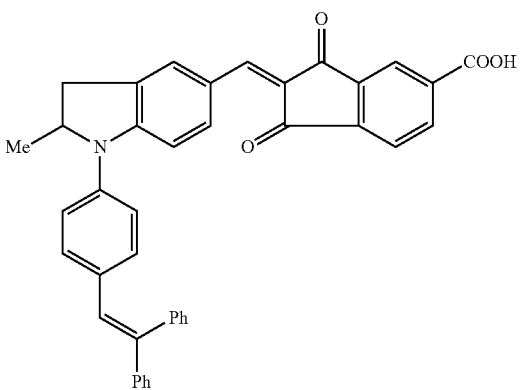

-continued
I-115
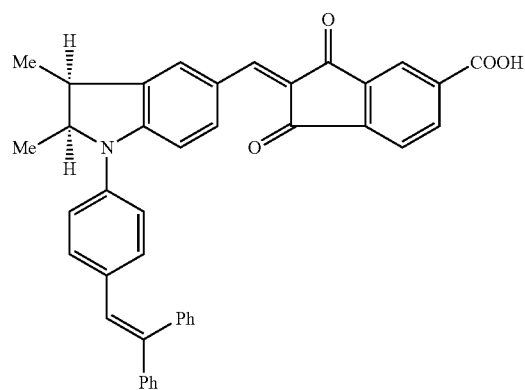
I-116
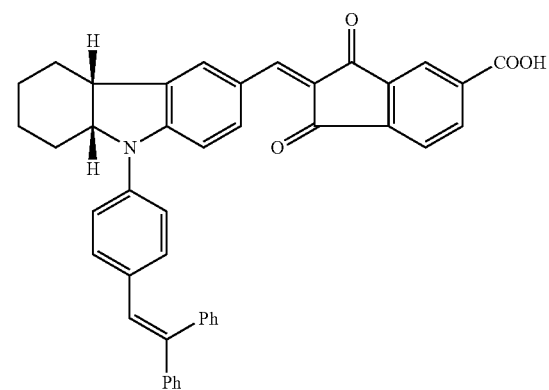
I-117
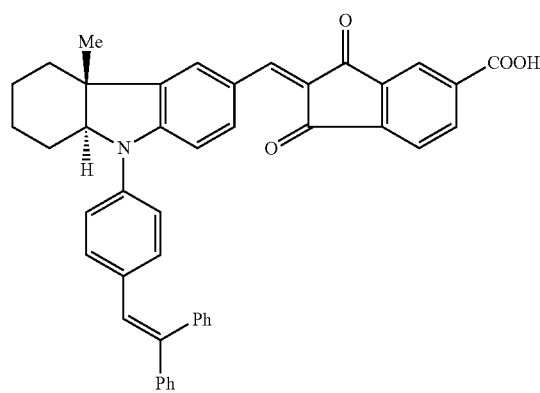
I-118
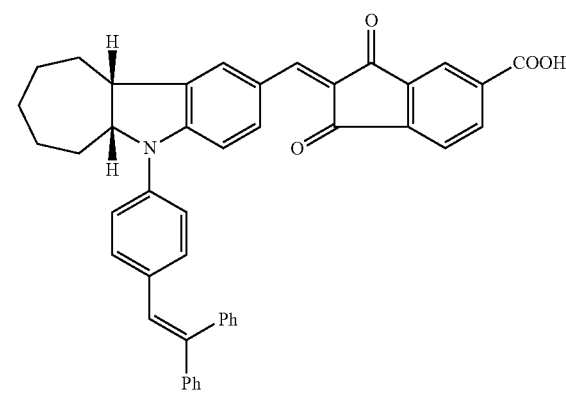
I-119
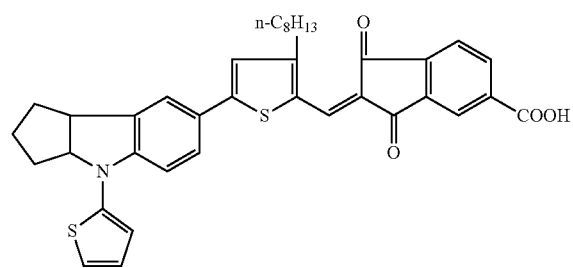
I-120
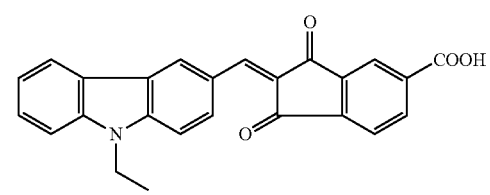
[Chemical 14]
I-121
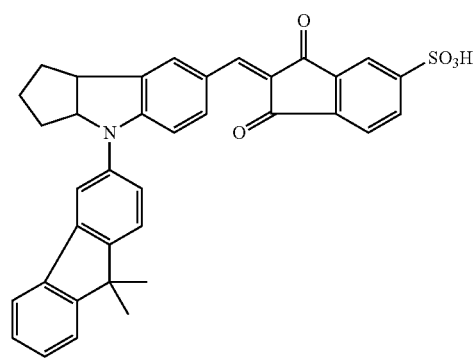
I-122
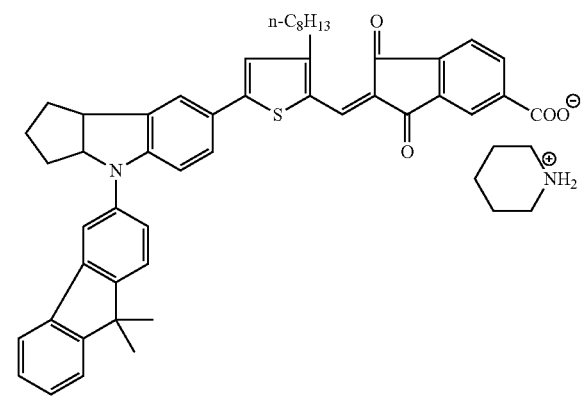

I-123
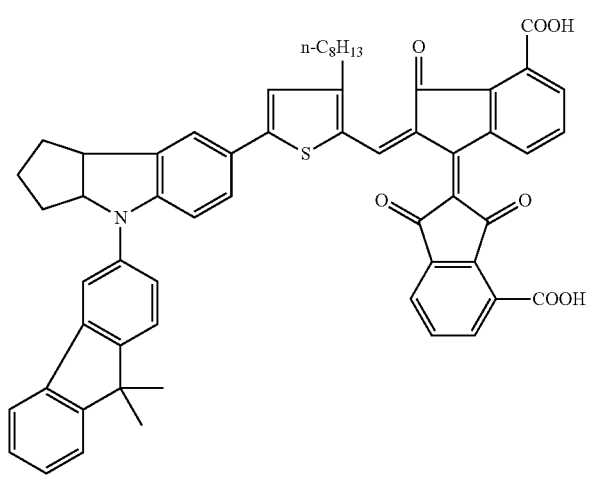
Next, the synthesis route of the dye represented by the general formula (I) will be described.
[Chemical 15]
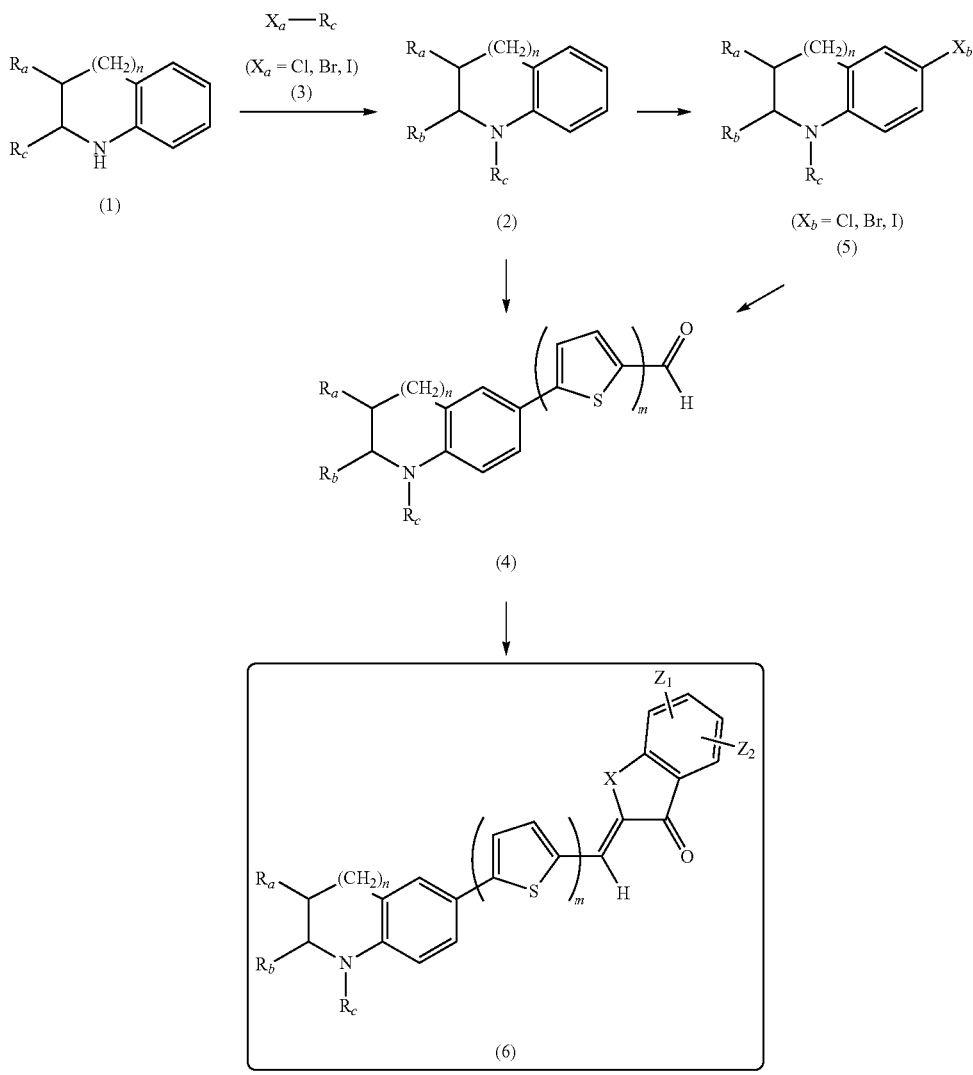

As a method for synthesizing intermediate (I), a so-called Fischer indole synthesis method, in which arylhydrazone produced from ketone and arylhydrazine is heated under acid catalyst, such as sulfuric acid, or the like may be used. Further, a Skraup method or the like may be used to synthesize a quinoline ring. These hetero-rings may be reduced to intermediate (1) by using an appropriate method, such as catalytic reduction.

Intermediate (2) is easily synthesizable by a coupling reaction between intermediate (1) and intermediate (3) using palladium catalyst.

As a method for synthesizing intermediate (4) from intermediate (2) (m=0), formylation typified by a Vilsmeier reaction may be named.

When a conjugated chain is introduced (m≠0), first, intermediate (2) is converted to a bromo-substituted product (5) by a halogenating agent, such as NBS (N-Bromosuccinimide). Then, after a conjugated chain is extended by Suzuki coupling or the like, intermediate (4) is synthesizable through formylation by a Vilsmeier reaction. It is possible to extend the conjugated chain and to introduce a formyl group in one step by using borate ester already having the formyl group in Suzuki coupling. The Suzuki coupling is a method in which an organic halogen compound and an organic boron compound are cross-coupled under palladium catalyst. The Suzuki coupling is a useful method that is widely used because of its relatively soft conditions and excellent selection characteristics of functional groups.

As a method for obtaining dye (6) by condensation of intermediate (4) and an enone compound, a method, such as aldol condensation and Knoevenagel condensation, by reaction between a carbonyl compound and active methylene, and a method of synthesizing olefin by a Wittig reaction may be named.

Next, the photoelectric conversion device of the present disclosure will be described with reference to drawings. FIG. 1 is a schematic block diagram illustrating an embodiment of a photoelectric conversion device in the present disclosure. A photoelectric conversion device 1 includes a semiconductor layer 3 having a light absorption layer formed by causing an oxide semiconductor layer to adsorb dye (the photosensitizer of the present disclosure), an electrolyte layer 4 and a counter electrode 5 deposited, in this order, on a substrate 2 having conductivity on its surface.

As the conductive substrate, a substrate, such as metal, the base of which itself has conductivity may be used. Alternatively, when the substrate has conductivity on its surface, glass or plastic may be used as the base. In this case, as the material of the conductive layer, tin-doped indium oxide (ITO), fluorine-doped tin oxide (FTO), gold, platinum or the like, or a combination of two or more of them may be used. It is possible to form a substrate having conductivity on its surface by directly forming this on the substrate by using a vacuum deposition method, a sputter deposition method, an ion plating method, a chemical vapor deposition method (CVD) and the like, or by attaching, onto the substrate, a film in which these kinds of material have been formed.

Specific examples of the oxide semiconductor are oxides of titanium, tin, zinc, tungsten, zirconium, gallium, indium, yttrium, niobium, tantalum, vanadium and the like. The oxides of titanium, tin, zinc, niobium, tungsten and the like of them are desirable, and the oxides of tin and zinc are desirable from the viewpoints of (1) low cost, (2) easy formation of porous material, (3) conductivity, durability, stability and safety as an electrode, and (4) energy level matching characteristics with the photosensitizer synthesized in the present disclosure. There oxide semiconductors may be used alone or at least two kinds of them may be used together.

The oxide semiconductor may form porous material on the substrate by application of micro-particles of these oxide semiconductors onto the substrate, and by heating by an electric furnace, microwaves or the like, or by electrodeposition.

As a method for causing the oxide semiconductor layer to adsorb dye, a method, such as impregnating a substrate on which this oxide semiconductor layer has been formed in dye solution or dye dispersion solution, may be used, and the semiconductor layer is formable by this method. The concentration of the solution may be appropriately determined based on the dye. Examples of desirable solvent usable to dissolve the dye are methanol, ethanol, acetonitrile, dimethylsulfoxide, dimethylformamide, acetone, t-butanol and the like.

Here, in the case that a thin-film of oxide semiconductor micro-particles adsorbs dye, co-adsorbent may be added to the dye solution. As the co-adsorbent, a steroid-based compound, such as cholic acid, crown ether, cyclodextrin, calixarene and polyethylene oxide, may be named. Deoxycholic acid, dehydrocholic acid, cholic acid methyl ester, sodium cholate and the like are more desirable.

The electrolyte layer may be formed by using liquid electrolyte in which a mixed solution of acetonitrile and ethylene carbonate, or methoxypropionitrile or the like is used as solvent, and electrolyte composed of metal iodine or iodide, such as lithium iodide, is added, coagulated electrolyte, such as polymer gel electrolyte solution, or solid electrolyte, such as p-type semiconductor and hole transport agent.

When a counter electrode requires transparency, the counter electrode may be produced in a similar manner to the aforementioned substrate having conductivity. When the counter electrode does not require transparency, the counter electrode may be produced by using carbon, conductive polymer, general metal or the like.

The photosensitizer of the present disclosure may be used also as a light absorption layer of an organic thin-film solar cell.

Next, the present disclosure will be described more in detail by using examples.

EXAMPLES

The structure of intermediates (A-01) through (A-03), intermediate aldehyde (B-01) through (B-13) and an intermediate (C-01) in the present examples is representable by the following chemical formulae:

[Chemical 16]

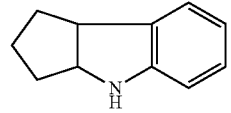

A-01

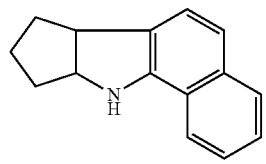

A-02

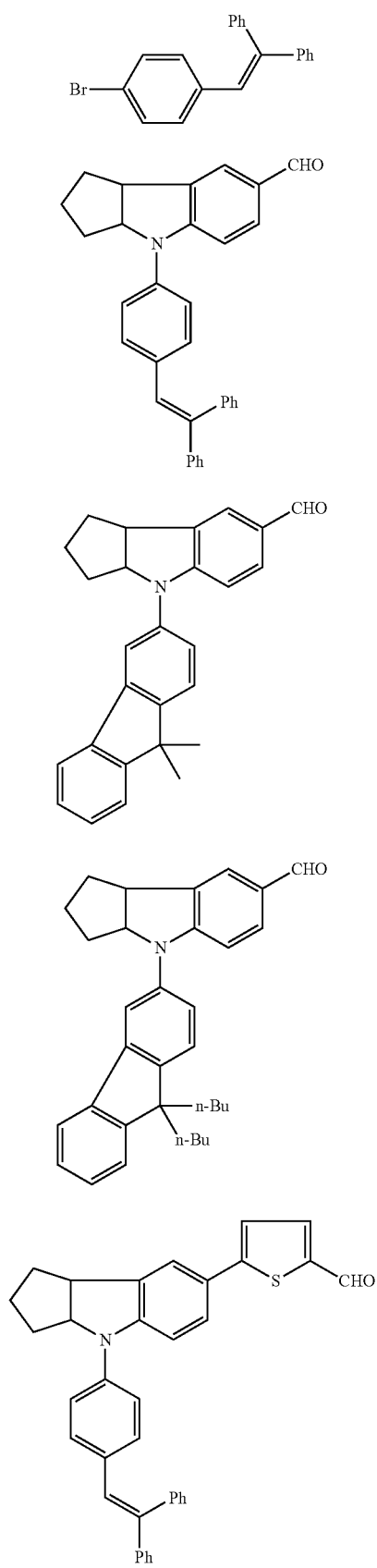
A-03
B-01
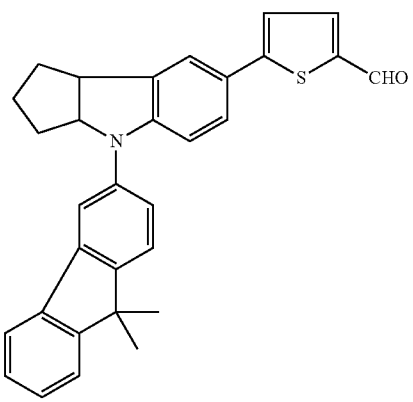
B-02
B-03
B-04
[Chemical 17]
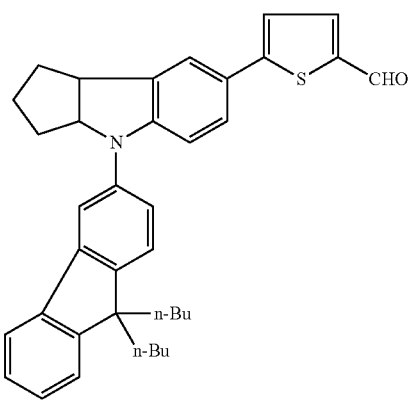
B-05
B-06
B-07
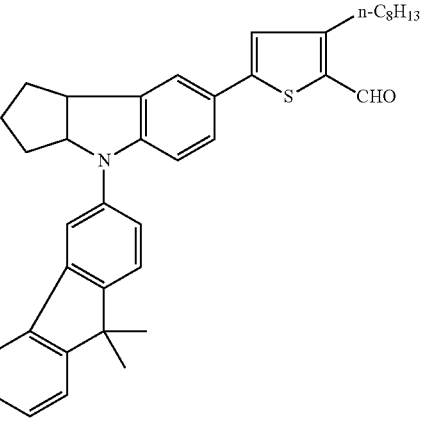

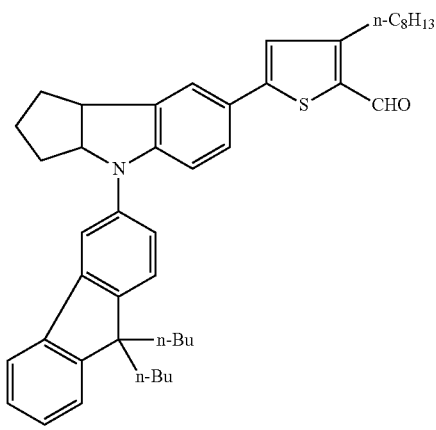

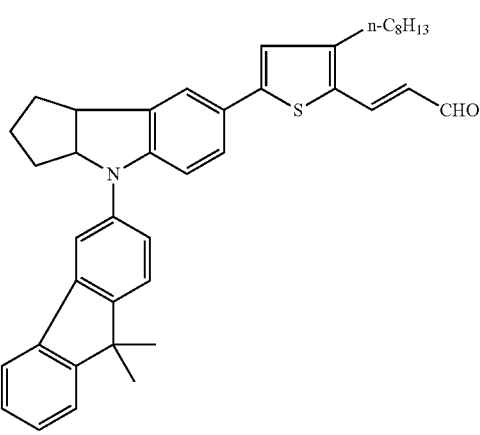

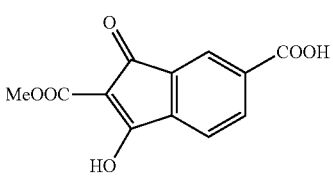

[Synthesis of Intermediates]

(Synthesis of Aldehyde (B-01))

Intermediate (A-01) (5.2 g), intermediate (A-03) (11.7 g), potassium t-butoxide (5.5 g), palladium acetate (74 mg) and tri t-butylphosphine (0.3 g) were dissolved in m-xylene (40 mL), and the inside of the system was substituted with nitrogen. After then, the inside of the system was stirred for 8 hours while heated at 120° C. After the reacted mixture was cooled down to room temperature, undissolved substance was filtered out, and filtrate was washed with water, and dried with anhydrous sodium sulfate. After then, brown oil was obtained by concentration under reduced pressure (15.0 g). Next, this brown oil (15.0 g) was dropped into Vilsmeier reagent prepared by dropping phosphoryl chloride (10.0 g) into DMF (25 mL) under ice cooling, and stirred for 3 hours at room temperature. Water (100 ml) was added to the reacted solution, and then, 25% sodium hydroxide aqueous solution was added so as to become pH11. Extraction on this reacted solution was performed with chloroform, and an organic layer was dried with anhydrous sodium sulfate. After then, a residue obtained by concentration under reduced pressure was separated and purified by column chromatography (silica gel, developing solvent: $CHCl_3$). Accordingly, 11.6 g of ocher solid of aldehyde (B-01) was obtained (yield was 80%).

With respect to the obtained aldehyde (B-01), structure was identified by an NMR analysis.

$^1$H NMR (400 MHz, $CDCl_3$)

δ(ppm)=9.70 (1H, s), 7.61 (1H, dd, J=1.6, 1.2 Hz), 7.50 (1H, dd, J=8.4, 1.6 Hz), 7.24-7.41 (10H, m), 7.07 (2H, d, J=9.2 Hz), 7.03 (2H, d, J=8.8 Hz), 6.95 (1H, s), 6.85 (1H, d, J=8.4 Hz), 4.83-4.87 (1H, m), 3.78-3.83 (1H, m), 2.00-2.10 (1H, m), 1.82-1.91 (2H, m), 1.73-1.80 (1H, m), 1.62-1.71 (1H, m), 1.40-1.52 (1H, m)

(Synthesis of Aldehyde (B-02))

Aldehyde (B-02) was synthesized through a similar route to (Synthesis of aldehyde (B-01)) also by using corresponding intermediates.

With respect to the obtained aldehyde (B-02), structure was identified by an NMR analysis.

$^1$H NMR (400 MHz, $CDCl_3$)

δ(ppm)=9.71 (1H, s), 7.72 (1H, d, J=8.0 Hz), 7.68 (1H, d, J=6.8 Hz), 7.66 (1H, s), 7.54 (1H, dd, J=8.0, 1.2 Hz), 7.43 (1H, d, J=6.8 Hz), 7.36 (1H, d, J=2.0 Hz), 7.33 (1H, dd, J=7.2, 1.2 Hz), 7.31 (1H, dd, J=7.6, 2.0 Hz), 7.26 (1H, dd, J=8.4, 2.0 Hz), 6.85 (1H, d, J=8.4 Hz), 5.00 (1H, br.t, J=7.2 Hz), 3.87 (1H, dt, J=8.4, 2.4 Hz), 2.04-2.14 (1H, m), 1.88-1.99 (2H, m), 1.76-1.85 (1H, m), 1.67-1.75 (1H, m), 1.52-1.61 (1H, m), 1.51 (3H, s), 1.50 (3H, s)

(Synthesis of Aldehyde (B-03))

Aldehyde (B-03) was synthesized through a similar route to (Synthesis of aldehyde (B-01)) also by using corresponding intermediates.

With respect to the obtained aldehyde (B-03), structure was identified by an NMR analysis.

$^1$H NMR (400 MHz, $CDCl_3$)

δ(ppm) 9.71 (1H, s), 7.70 (1H, d, J=8.1 Hz), 7.67 (1H, d, J=6.3 Hz), 7.66 (1H, s), 7.54 (1H, dd, J=8.3, 1.4 Hz), 7.25-7.35 (5H, m), 6.83 (1H, d, J=8.3 Hz), 5.02 (1H, br.t, J=6.8 Hz), 3.87 (1H, br.t, J=7.3 Hz), 2.05-2.14 (1H, m), 1.90-1.98 (6H, m), 1.69-1.81 (2H, m), 1.50-1.59 (1H, m), 1.09 (4H, m), 0.72 (3H, t, J=7.3 Hz), 0.68 (3H, t, J=7.3 Hz), 0.59-0.73 (4H, m)

(Synthesis of Aldehyde (B-04))

After coupling of intermediate (A-01) and intermediate (A-03) in a similar method to (Synthesis of Aldehyde (B-01)), the coupled product was brominated by NBS, and reacted with boronic acids, and the reacted product was reacted with Vilsmeier reagent. Accordingly, synthesis was performed.

With respect to the obtained aldehyde (B-04), structure was identified by an NMR analysis.

$^1$H NMR (400 MHz, $CDCl_3$)

δ(ppm)=9.82 (1H, s), 7.67 (1H, d, J=4.0 Hz), 7.24-7.39 (13H, m), 7.05 (2H, d, J=8.8 Hz), 7.00 (2H, d, J=9.2 Hz), 6.95 (1H, d, J=8.0 Hz), 6.94 (1H, s), 4.75-4.80 (1H, m), 3.81-3.86 (1H, m), 2.02-2.11 (1H, m), 1.77-1.93 (3H, m), 1.61-1.71 (1H, m), 1.43-1.54 (1H, m)

(Synthesis of Aldehyde (B-05))

Aldehyde (B-05) was synthesized through a similar route to (Synthesis of aldehyde (B-04)) also by using corresponding intermediates.

With respect to the obtained aldehyde (B-05), structure was identified by an NMR analysis.

$^1$H NMR (400 MHz, $CDCl_3$)

δ(ppm)=9.83 (1H, s), 7.66-7.70 (3H, m), 7.41-7.44 (3H, m), 7.23-7.36 (5H, m), 6.97 (1H, d, J=8.0 Hz), 4.92-4.95 (1H, m), 3.87-3.91 (1H, m), 2.07-2.13 (1H, m), 1.86-1.98 (3H, m), 1.58-1.62 (1H, m), 1.51 (3H, s), 1.50 (3H, s)

(Synthesis of Aldehyde (B-06))

Aldehyde (B-06) was synthesized through a similar route to (Synthesis of aldehyde (B-4)) also by using corresponding intermediates.

With respect to the obtained aldehyde (B-06), structure was identified by an NMR analysis.

$^1$H NMR (400 MHz, $CDCl_3$)

δ(ppm)=9.83 (1H, s), 7.68 (1H, d, J=4.0 Hz), 7.67 (1H, d, J=10.0 Hz), 7.63 (1H, dd, J=8.8, 8.8 Hz), 7.44 (1H, br.s), 7.41 (1H, dd, J=8.8, 8.0 Hz), 7.33 (1H, d, J=6.8 Hz), 7.31 (1H, d, J=6.4 Hz), 7.26-7.28 (3H, m), 7.25 (1H, s), 6.94 (1H, d, J=8.4 Hz), 4.94-4.98 (1H, m), 3.86-3.91 (1H, m), 2.06-2.16 (1H, m), 1.90-2.01 (6H, m), 1.79-1.88 (1H, m), 1.67-1.75 (1H, m), 1.52-1.63 (1H, m), 1.04-1.16 (4H, m), 0.72 (3H, t, J=7.2 Hz), 0.69 (3H, t, J=7.2 Hz), 0.61-0.71 (4H, m)

(Synthesis of Aldehyde (B-07))

Aldehyde (B-07) was synthesized through a similar route to (Synthesis of aldehyde (B-04)) also by using corresponding intermediates.

With respect to the obtained aldehyde (B-07), structure was identified by an NMR analysis.

$^1$H NMR (400 MHz, $CDCl_3$)

δ(ppm)=9.96 (1H, s), 7.69 (1H, d, J=8.0 Hz), 7.67 (1H, d, J=7.2 Hz), 7.43 (1H, s), 7.40-7.42 (2H, m), 7.36 (1H, d, J=2.0 Hz), 7.33 (1H, dt, J=7.2, 1.2 Hz), 7.27 (1H, dt, J=7.2, 1.2 Hz), 7.24 (1H, dd, J=8.0, 1.6 Hz), 7.09 (1H, s), 6.96 (1H, d, J=8.0 Hz), 4.91-4.95 (1H, m), 3.86-3.91 (1H, m), 2.93 (2H, dd, J=8.0, 7.6 Hz), 2.06-2.16 (1H, m), 1.82-2.02 (3H, m), 1.67-1.75 (3H, m), 1.53-1.63 (1H, m), 1.51 (3H, s), 1.50 (3H, s), 1.30-1.43 (6H, m), 0.90 (3H, t, J=6.8 Hz)

(Synthesis of Aldehyde (B-08))

Aldehyde (B-08) was synthesized through a similar route to (Synthesis of aldehyde (B-04)) also by using corresponding intermediates.

With respect to the obtained aldehyde (B-08), structure was identified by an NMR analysis.

$^1$H NMR (400 MHz, $CDCl_3$)

δ(ppm)=9.96 (1H, s), 7.67 (1H, d, J=8.0 Hz), 7.65 (1H, d, J=8.8 Hz), 7.43 (1H, s), 7.40 (1H, dd, J=8.4, 1.6 Hz), 7.32 (2H, dd, J=7.2, 6.0 Hz), 7.26 (2H, dd, J=7.6, 7.6 Hz), 7.24 (1H, s), 7.09 (1H, s), 6.94 (1H, d, J=8.4 Hz), 4.94-4.98 (1H, m), 3.86-3.90 (1H, m), 2.93 (2H, dd, J=8.0, 7.6 Hz), 2.06-2.15 (1H, m), 1.91-2.01 (6H, m), 1.79-1.88 (1H, m), 1.67-1.75 (3H, m), 1.52-1.62 (1H, m), 1.30-1.43 (6H, m), 1.04-1.16 (4H, m), 0.90 (3H, t, J=6.8 Hz), 0.71 (3H, t, J=7.2 Hz), 0.69 (3H, t, J=7.2 Hz), 0.60-0.70 (4H, m)

(Synthesis of Aldehyde (B-09))

Aldehyde (B-09) was synthesized through a similar route to (Synthesis of aldehyde (B-04)) also by using corresponding intermediates.

With respect to the obtained aldehyde (B-09), structure was identified by an NMR analysis.

$^1$H NMR (400 MHz, $CDCl_3$)

δ(ppm)=9.60 (1H, d, J=7.6 Hz), 7.68 (2H, dd, J=8.8, 8.0 Hz), 7.53 (1H, d, J=15.6 Hz), 7.42 (1H, d, J=7.6 Hz), 7.39 (1H, s), 7.37 (2H, dd, J=8.4, 7.6 Hz), 7.33 (1H, dt, J=7.6, 7.2 Hz), 7.27-7.29 (2H, m), 7.24 (1H, dd, J=8.8, 8.4 Hz), 7.17 (1H, d, J=3.6 Hz), 6.98 (1H, d, J=8.4 Hz), 6.44 (1H, dd, J=7.6, 7.6 Hz), 4.90-4.94 (1H, m), 3.86-3.91 (1H, m), 2.07-2.16 (1H, m), 1.83-2.01 (3H, m), 1.66-1.75 (1H, m), 1.55-1.64 (1H, m), 1.51 (3H, s), 1.50 (3H, s)

(Synthesis of Aldehyde (B-10))

Aldehyde (B-10) was synthesized through a similar route to (Synthesis of aldehyde (B-04)) also by using corresponding intermediates.

With respect to the obtained aldehyde (B-10), structure was identified by an NMR analysis.

$^1$H NMR (400 MHz, CDCl$_3$)

δ(ppm)=9.60 (1H, d, J=8.0 Hz), 7.66 (2H, ddd, J=9.6, 9.2, 7.2 Hz), 7.53 (1H, d, J=15.6 Hz), 7.40 (1H, br.s), 7.37 (1H, dd, J=8.4, 2.0 Hz), 7.33 (1H, d, J=7.2 Hz), 7.32 (1H, s), 7.28-7.30 (2H, m), 7.24-7.27 (2H, m), 7.18 (1H, d, J=4.0 Hz), 6.96 (1H, d, J=8.4 Hz), 6.44 (1H, dd, J=15.6, 7.6 Hz), 4.93-4.97 (1H, m), 3.87-3.90 (1H, m), 2.06-2.16 (1H, m), 1.91-2.01 (6H, m), 1.80-1.89 (1H, m), 1.67-1.75 (1H, m), 1.53-1.63 (1H, m), 1.05-1.14 (4H, m), 0.72 (3H, t, J=7.2 Hz), 0.69 (3H, t, J=7.6 Hz), 0.61-0.69 (4H, m)

(Synthesis of Aldehyde (B-11))

Aldehyde (B-11) was synthesized through a similar route to (Synthesis of aldehyde (B-04)) also by using corresponding intermediates.

With respect to the obtained aldehyde (B-11), structure was identified by an NMR analysis.

$^1$H NMR (400 MHz, CDCl$_3$)

δ(ppm)=9.60 (1H, d, J=8.0 Hz), 7.68 (1H, d, J=8.0 Hz), 7.66 (1H, d, J=8.8 Hz), 7.61 (1H, d, J=15.6 Hz), 7.41 (1H, d, J=7.2 Hz), 7.39 (1H, s), 7.35-7.38 (2H, m), 7.33 (1H, dt, J=7.2, 1.2 Hz), 7.27 (1H, dt, J=7.2, 1.2 Hz), 7.24 (1H, dd, J=8.4, 2.0 Hz), 7.05 (1H, s), 6.97 (1H, d, J=8.0 Hz), 6.40 (1H, dd, J=15.2, 7.6 Hz), 4.90-4.94 (1H, m), 3.86-3.90 (1H, m), 2.72 (2H, dd J=8.0, 7.6 Hz), 2.06-2.17 (1H, m), 1.83-2.03 (3H, m), 1.62-1.75 (3H, m), 1.51 (3H, s), 1.50 (3H, s), 1.47-1.55 (1H, m), 1.31-1.42 (6H, m), 0.90 (3H, t, J=6.8 Hz)

(Synthesis of Aldehyde (B-12))

Aldehyde (B-12) was synthesized through a similar route to (Synthesis of aldehyde (B-04)) also by using corresponding intermediates.

With respect to the obtained aldehyde (B-12), structure was identified by an NMR analysis.

$^1$H NMR (400 MHz, CDCl$_3$)

δ(ppm)=9.61 (1H, d, J=7.6 Hz), 7.67 (1H, d, J=8.8 Hz), 7.63-7.66 (1H, m), 7.62 (1H, d, J=15.2 Hz), 7.39 (1H, s), 7.36 (1H, dd, J=8.0, 1.6 Hz), 7.33 (1H, d, J=7.2 Hz), 7.31 (1H, d, J=6.4 Hz), 7.25-7.28 (2H, m), 7.24 (1H, s), 7.06 (1H, s), 6.95 (1H, d, J=8.4 Hz), 6.40 (1H, dd, J=15.6, 8.0 Hz), 4.93-4.96 (1H, m), 3.86-3.90 (1H, m), 2.72 (2H, dd, J=8.0, 7.6 Hz), 2.06-2.15 (1H, m), 1.90-2.01 (6H, m), 1.80-1.89 (1H, m), 1.62-1.74 (3H, m), 1.51-1.61 (1H, m), 1.28-1.42 (6H, m), 1.05-1.14 (4H, m), 0.90 (3H, t, J=7.2 Hz), 0.72 (3H, t, J=7.2 Hz), 0.69 (3H, t, J=7.2 Hz), 0.61-0.70 (4H, m)

(Synthesis of Aldehyde (B-13))

Aldehyde (B-13) was synthesized through a similar route to (Synthesis of aldehyde (B-01)) by using intermediate (A-02) and intermediate (A-03).

With respect to the obtained aldehyde (B-13), structure was identified by an NMR analysis.

$^1$H NMR (400 MHz, CDCl$_3$)

δ(ppm)=9.28 (1H, d, J=8.0 Hz), 7.76 (1H, s), 7.49-7.54 (1H, s), 7.28-7.38 (10H, m), 7.23-7.25 (2H, m), 7.16-7.21 (1H, m), 6.97-6.99 (3H, m), 6.89 (1H, d, J=7.3 Hz), 4.58 (1H, ddd, J=8.9, 6.7, 2.5 Hz), 4.12 (1H, dt, J=6.1, 2.5 Hz), 2.03-2.14 (2H, m), 1.89-1.98 (2H, m), 1.63-1.72 (1H, m), 1.41-1.53 (1H, m)

(Synthesis of Intermediate (C-01))

Methyl acetoacetate (12.00 g) and triethylamine (33.78 g) were dropped into acetic anhydride solution (75 mL) of trimellitic anhydride (manufactured by Tokyo Chemical Industry Co., Ltd.) (10.18 g), and stirred for 1.5 hours while heated at 100° C. After the reacted mixture was cooled down to room temperature, solvent was distilled away, and the remaining product was separated and purified by column chromatography (silica gel, developing solvent: CHCl$_3$/MeOH=10/1). Accordingly, black liquid was obtained (12.65 g). Next, ammonium acetate (6.49 g) was added to methanol solution (150 mL) of the obtained black liquid (12.65 g), and stirred for 3 hours while heated at 75° C., and the product was solidified. Coarse crystals were separated by filtration, and washed with methanol. Accordingly, 5.76 g of intermediate (C-01) was obtained as yellow solid (yield was 44%). With respect to the obtained intermediate (C-01), structure was identified by an NMR analysis. Here, hydrogen of carboxylic acid was not observed.

$^1$H NMR (400 MHz, DMSO-d$_6$)

δ(ppm)=7.92 (H, d, J=7.6 Hz), 7.80 (1H, s), 7.25 (1H, d, J=7.6 Hz), 7.14 (1H, br.s), 3.49 (3H, s)

Synthesis of Example 1 (I-03)

Aldehyde (B-01) (0.88 g) and intermediate (C-01) (0.50 g) were dissolved in acetic acid (10 mL), and stirred for 4 hours while heated at 100° C. When the reacted mixture was cooled down to room temperature, the reacted mixture was solidified. Coarse crystals were separated by filtration, and separated and purified by column chromatography (silica gel, developing solvent: CHCl$_3$/MeOH=100/1). Accordingly, 0.85 g of dye (I-03) was obtained as brown solid (yield was 69%). λmax=545 nm (CHCl$_3$).

With respect to the dye (I-03), structure was identified by an NMR analysis.

$^1$H NMR (400 MHz, DMSO-d$_6$)

δ(ppm)=13.65 (1H, br.s), 8.67 (1H, br.s), 8.33 (1H, dd, J=8.0, 7.6 Hz), 8.24 (1H, d, J=11.6 Hz), 8.20 (1H, br.s), 7.94 (1H, dd, J=7.6, 7.6 Hz), 7.65 (1H, s), 7.41-7.49 (3H, m), 7.30-7.38 (5H, m), 7.19-7.23 (4H, m), 7.11 (1H, s), 7.07 (2H, d, J=8.4 Hz), 6.87 (1H, d, J=8.8 Hz), 5.07-5.11 (1H, m), 3.82-3.87 (1H, m), 2.03-2.12 (1H, m), 1.69-1.83 (2H, m), 1.59-1.67 (2H, m), 1.27-1.38 (1H, m)

Synthesis of Example 2 (I-05)

Dye (I-05) was obtained as black solid using aldehyde intermediate (B-02) by using a similar method to Example 1. λmax=541 nm (CHCl$_3$).

With respect to the obtained dye (I-05), structure was identified by an NMR analysis.

$^1$H NMR (400 MHz, DMSO-d$_6$)

δ(ppm)=13.63 (1H, br.s), 8.72 (1H, br.s), 8.35 (1H, d, J=8.0 Hz), 8.28 (1H, br.s), 8.25 (1H, d, J=11.6 Hz), 7.95 (1H, dd, J=8.0, 7.6 Hz), 7.90 (1H, d, J=8.4 Hz), 7.83 (1H, d, J=7.2 Hz), 7.69 (1H, s), 7.67 (1H, d, J=1.6 Hz), 7.56 (1H, d, J=7.2 Hz), 7.41 (1H, dd, J=8.0, 1.2 Hz), 7.36 (1H, dd, J=8.0, 7.2 Hz), 7.32 (1H, dd, J=8.4, 7.2 Hz), 6.87 (1H, d, J=8.4 Hz), 5.24-5.27 (1H, m), 3.90-3.94 (1H, m), 2.08-2.18 (1H, m), 1.74-1.88 (3H, m), 1.64-1.73 (1H, m), 1.50 (3H, s), 1.47 (3H, s), 1.37-1.53 (1H, m)

Synthesis of Example 3 (I-06)

Dye (I-06) was obtained as black solid using aldehyde intermediate (B-03) by using a similar method to Example 1. λmax=546 nm (CHCl$_3$).

With respect to the obtained dye (I-06), structure was identified by an NMR analysis.

$^1$H NMR (400 MHz, DMSO-d$_6$)

δ(ppm)=13.07 (1H, br.s), 8.17 (1H, br.s), 7.81 (1H, dd, J=7.6, 7.2 Hz), 7.73 (2H, d, J=9.6 Hz), 7.41 (1H, d, J=8.0 Hz), 7.34 (1H, d, J=8.4 Hz), 7.27 (1H, d, J=7.2 Hz), 7.14 (1H, s), 6.99 (1H, s), 6.92 (1H, d, J=6.8 Hz), 6.88 (1H, d, J=8.0 Hz), 6.83 (1H, dd, J=7.2, 6.0 Hz), 6.80 (1H, dd, J=7.2, 6.4 Hz), 6.30 (1H, d, J=8.4 Hz), 4.72-4.75 (1H, m), 3.36-3.40 (1H, m), 1.57-1.65 (1H, m), 1.43-1.56 (4H, m), 1.28-1.35 (1H, m), 1.11-1.26 (3H, m), 0.84-0.95 (1H, m), 0.45-0.59 (4H, m), 0.16 (3H, t, J=7.2 Hz), 0.10 (3H, t, J=7.2 Hz), 0.02-0.04 (4H, m)

Synthesis of Example 4 (I-26)

Dye (I-26) was obtained as black solid using aldehyde intermediate (B-04) by using a similar method to Example 1. λmax=607 nm (CHCl$_3$).

With respect to the obtained dye (I-26), structure was identified by an NMR analysis.

$^1$H NMR (400 MHz, DMSO-d$_6$)

δ(ppm)=13.62 (1H, br.s), 8.32 (1H, dd, J=8.0, 7.6 Hz), 8.23 (1H, d, J=10.4 Hz), 8.17 (1H, d, J=4.0 Hz), 7.95 (1H, s), 7.92 (1H, d, J=8.0 Hz), 7.59 (1H, d, J=4.4 Hz), 7.57 (1H, s), 7.45 (1H, d, J=6.8 Hz), 7.42 (1H, d, J=7.6 Hz), 7.39-7.52 (2H, m), 7.33 (1H, d, J=6.8 Hz), 7.30 (1H, s), 7.29 (1H, d, J=7.2 Hz), 7.26-7.36 (3H, m), 7.20 (1H, d, J=7.2 Hz), 7.09 (2H, d, J=8.4 Hz), 7.05 (1H, s), 7.00 (2H, d, J=8.4 Hz), 6.94 (1H, dd, J=8.4, 3.2 Hz), 4.85-4.88 (1H, m), 3.80-3.84 (1H, m), 2.00-2.10 (1H, m), 1.76-1.86 (2H, m), 1.55-1.70 (2H, m), 1.27-1.39 (1H, m)

Synthesis of Example 5 (I-27)

Dye (I-27) was obtained as blackish purple solid using aldehyde intermediate (B-05) by using a similar method to Example 1. λmax=616 nm (CHCl$_3$).

With respect to the obtained dye (I-27), structure was identified by an NMR analysis.

$^1$H NMR (400 MHz, DMSO-d$_6$)

δ(ppm)=13.66 (1H, br.s), 8.35 (1H, d, J=8.0 Hz), 8.25 (1H, br.s), 8.24 (1H, d, J=8.4 Hz), 8.20 (1H, d, J=4.4 Hz), 7.98 (1H, s), 7.94 (1H, d, J=8.0 Hz), 7.81 (1H, d, J=8.4 Hz), 7.76 (1H, d, J=7.2 Hz), 7.62-7.63 (1H, m), 7.62 (1H, s), 7.58-7.61 (1H, m), 7.54 (1H, s), 7.53 (1H, d, J=6.8 Hz), 7.33 (1H, dd, J=8.0, 6.8 Hz), 7.28 (1H, dd, J=7.6, 6.4 Hz), 6.98 (1H, dd, J=8.4, 8.4 Hz), 5.04-5.07 (1H, m), 3.86-3.91 (1H, m), 2.05-2.16 (1H, m), 1.73-1.92 (3H, m), 1.60-1.70 (1H, m), 1.48 (3H, s), 1.47 (3H, s), 1.37-1.52 (1H, m)

Synthesis of Example 6 (I-28)

Dye (I-28) was obtained as black solid using aldehyde intermediate (B-06) by using a similar method to Example 1. λmax=619 nm (CHCl$_3$).

With respect to the obtained dye (I-28), structure was identified by an NMR analysis.

$^1$H NMR (400 MHz, DMSO-d$_6$)

δ(ppm)=13.67 (1H, br.s), 8.34 (1H, dd, J=9.2, 8.4 Hz), 8.25 (1H, d, J=10.4 Hz), 8.21 (1H, d, J=4.0 Hz), 8.00 (1H, s), 7.94 (1H, d, J=8.0 Hz), 7.80 (1H, d, J=8.4 Hz), 7.74 (1H, d, J=7.2 Hz), 7.67 (1H, d, J=4.4 Hz), 7.65 (1H, s), 7.58 (1H, d, J=8.4 Hz), 7.42 (1H, d, J=7.2 Hz), 7.40 (1H, s), 7.30-7.33 (2H, m), 7.27 (1H, dd, J=7.6, 7.2 Hz), 6.94 (1H, dd, J=8.4, 2.8 Hz), 5.08-5.12 (1H, m), 3.86-3.90 (1H, m), 1.94-2.15 (5H, m), 1.72-1.88 (3H, m), 1.61-1.69 (1H, m), 1.35-1.46 (1H, m), 0.99-1.11 (4H, m), 0.67 (3H, t, J=7.6 Hz), 0.63 (3H, t, J=7.2 Hz), 0.50-0.57 (4H, m)

Synthesis of Example 7 (I-31)

Dye (I-31) was obtained as black solid using aldehyde intermediate (B-07) by using a similar method to Example 1. λmax=617 nm (CHCl$_3$).

With respect to the obtained dye (I-31), structure was identified by an NMR analysis.

$^1$H NMR (400 MHz, DMSO-d$_6$)

δ(ppm)=13.60 (1H, br.s), 8.28 (1H, dd, J=8.0, 6.4 Hz), 8.18 (1H, d, J=3.2 Hz), 7.87 (1H, dd, J=7.2, 6.8 Hz), 7.80 (1H, d, J=1.2 Hz), 7.80 (1H, d, J=8.0 Hz), 7.75 (1H, d, J=7.6 Hz), 7.59 (1H, s), 7.52-7.55 (4H, m), 6.95 (1H, dd, J=8.4, 3.6 Hz), 5.01-5.05 (1H, m), 3.83-3.87 (1H, m), 2.82 (2H, t, J=7.2 Hz), 2.06-2.15 (1H, m), 1.73-1.90 (3H, m), 1.61-1.68 (3H, m), 1.48 (3H, s), 1.47 (3H, s), 1.40-1.46 (1H, m), 1.25-1.83 (6H, m), 0.86 (3H, dd, J=6.8, 6.4 Hz)

Synthesis of Example 8 (I-32)

Dye (I-32) was obtained as black solid using aldehyde intermediate (B-08) by using a similar method to Example 1. λmax=621 nm (CHCl$_3$).

With respect to the obtained dye (I-32), structure was identified by an NMR analysis.

$^1$H NMR (400 MHz, DMSO-d$_6$)

δ(ppm)=13.61 (1H, br.s), 8.28 (1H, dd, J=7.2, 6.4 Hz), 8.18 (1H, d, J=6.0 Hz), 7.86 (1H, dd, J=7.2, 6.8 Hz), 7.79 (1H, s), 7.78 (1H, d, J=9.2 Hz), 7.73 (1H, d, J=7.2 Hz), 7.59 (1H, br.s), 7.52 (1H, s), 7.50-7.55 (1H, m), 7.41 (1H, d, J=6.8 Hz), 7.38 (1H, s), 7.31 (1H, dd, J=7.6, 7.2 Hz), 7.29 (1H, s), 7.27 (1H, dd, J=8.4, 8.4 Hz), 6.90 (1H, dd, J=8.4, 8.4 Hz), 5.04-5.07 (1H, m), 3.81-3.85 (1H, m), 2.81 (2H, dd, J=7.6, 7.2 Hz), 1.94-2.13 (5H, m), 1.58-1.86 (6H, m), 1.19-1.46 (7H, m), 0.98-1.10 (4H, m), 0.85 (3H, t, J=6.4 Hz), 0.66 (3H, t, J=7.2 Hz), 0.62 (3H, t, J=7.2 Hz), 0.46-0.48 (4H, m)

Synthesis of Example 9 (I-44)

Dye (I-44) was obtained as purple solid using aldehyde intermediate (B-09) by using a similar method to Example 1. λmax=642 nm (CHCl$_3$).

With respect to the obtained dye (I-44), structure was identified by an NMR analysis.

$^1$H NMR (400 MHz, DMSO-d$_6$)

δ(ppm)=13.61 (1H, br.s), 8.31-8.34 (1H, m), 8.23 (1H, br.s), 7.89-7.97 (2H, m), 7.85 (1H, d, J=14.8 Hz), 7.79 (1H, d, J=8.0 Hz), 7.74 (1H, d, J=7.2 Hz), 7.61 (1H, d, J=11.6 Hz), 7.48 (1H, d, J=14.4 Hz), 7.45-7.55 (5H, m), 7.32 (1H, t, J=7.2 Hz), 7.25-7.29 (2H, m), 6.94 (1H, d, J=8.4 Hz), 4.99-5.02 (1H, m), 3.82-3.87 (1H, m), 2.04-2.14 (1H, m), 1.74-1.94 (3H, m), 1.60-1.70 (1H, m), 1.47 (6H, m), 1.37-1.52 (1H, m)

Synthesis of Example 10 (I-45)

Dye (I-45) was obtained as black solid using aldehyde intermediate (B-10) by using a similar method to Example 1. λmax=647 nm (CHCl$_3$).

With respect to the obtained dye (I-45), structure was identified by an NMR analysis.

$^1$H NMR (400 MHz, DMSO-d$_6$)

δ(ppm)=13.69 (1H, br.s), 8.34 (1H, ddd, J=7.6, 3.6, 1.2 Hz), 8.23 (1H, d, J=2.4 Hz), 7.90-7.94 (2H, m), 7.87 (1H, d, J=14.8 Hz), 7.77 (1H, d, J=8.0 Hz), 7.72 (1H, d, J=7.2 Hz), 7.63 (1H, dd, J=11.2, 2.0 Hz), 7.57 (1H, s), 7.52 (1H, d, J=4.0 Hz), 7.49 (1H, d, J=4.0 Hz), 7.46-7.48 (1H, m), 7.41 (1H, d, J=6.8 Hz), 7.36 (1H, s), 7.25-7.33 (3H, m), 6.91 (1H, d, J=8.0 Hz), 5.03-5.06 (1H, m), 3.82-3.86 (1H, m), 1.94-2.11 (5H, m), 1.70-1.88 (3H, m), 1.60-1.68 (1H, m), 1.34-1.44 (1H, m), 1.01-1.09 (4H, m), 0.66 (3H, t, J=7.6 Hz), 0.63 (3H, t, J=8.0 Hz), 0.50-0.57 (4H, m)

Synthesis of Example 11 (I-47)

Dye (I-47) was obtained as black solid using aldehyde intermediate (B-11) by using a similar method to Example 1. λmax=655 nm (CHCl$_3$).

With respect to the obtained dye (I-47), structure was identified by an NMR analysis.

$^1$H NMR (400 MHz, DMSO-d$_6$)

δ(ppm)=13.61 (1H, br.s), 8.30 (1H, ddd, J=7.6, 1.6, 1.6 Hz), 8.20 (1H, s), 8.02 (1H, d, J=14.4 Hz), 7.83-7.90 (2H, m), 7.78 (1H, d, J=8.0 Hz), 7.74 (1H, s), 7.72 (1H, dd, J=6.8, 1.6 Hz), 7.55 (1H, s), 7.52 (1H, d, J=7.6 Hz), 7.49 (1H, d, J=1.2 Hz), 7.45 (1H, ddd, J=8.4, 4.0, 2.0 Hz), 7.38 (1H, s), 7.32 (1H, ddd, J=7.2, 7.2, 1.2 Hz), 7.25-7.29 (2H, m), 6.93 (1H, dd, J=8.4, 1.2 Hz), 4.98-5.01 (1H, m), 3.81-3.86 (1H, m), 2.74 (2H, dd, J=8.0, 6.8 Hz), 2.03-2.13 (1H, m), 1.73-1.91 (3H, m), 1.57-1.67 (3H, m), 1.47 (3H, s), 1.46 (3H, s), 1.28-1.48 (7H, m), 0.87 (3H, t, J=6.8 Hz)

Synthesis of Example 12 (I-48)

Dye (I-48) was obtained as black solid using aldehyde intermediate (B-12) by using a similar method to Example 1. λmax=661 nm (CHCl$_3$).

With respect to the obtained dye (I-48), structure was identified by an NMR analysis.

$^1$H NMR (400 MHz, DMSO-d$_6$)

δ(ppm)=13.62 (1H, br.s), 8.28 (1H, d, J=8.0 Hz), 8.19 (1H, s), 7.99 (1H, d, J=14.4 Hz), 7.81-7.89 (2H, m), 7.75 (1H, d, J=8.0 Hz), 7.71 (1H, d, J=8.4 Hz), 7.70 (1H, dd, J=9.2, 3.2 Hz), 7.52 (1H, br.s), 7.41-7.44 (1H, m), 7.40 (1H, d, J=7.2 Hz), 7.36 (1H, s), 7.34 (1H, s), 7.30 (1H, dd, J=7.2, 6.4 Hz), 7.24-7.28 (2H, m), 6.87 (1H, dd, J=8.8, 2.4 Hz), 4.98-5.01 (1H, m), 3.78-3.82 (1H, m), 2.72 (2H, dd, J=7.6, 7.2 Hz), 1.93-2.11 (5H, m), 1.70-1.86 (3H, m), 1.56-1.65 (3H, m), 1.25-1.41 (7H, m), 0.98-1.10 (4H, m), 0.86 (3H, t, J=6.8 Hz), 0.65 (3H, t, J=7.2 Hz), 0.62 (3H, t, J=7.2 Hz), 0.48-0.57 (4H, m)

Synthesis of Example 13 (I-75)

Dye (I-75) was obtained as blackish purple solid using aldehyde intermediate (B-13) by using a similar method to Example 1. λmax=595 nm (CHCl$_3$).

With respect to the obtained dye (I-75), structure was identified by an NMR analysis.

$^1$H NMR (400 MHz, DMSO-d$_6$)

δ(ppm)=13.60 (1H, br.s), 9.59 (1H, s), 8.54 (1H, s), 8.35 (1H, d, J=7.2 Hz), 8.32-8.34 (1H, m), 8.24 (1H, d, J=10.0 Hz), 7.93 (1H, dd, J=8.4, 7.6 Hz), 7.63 (1H, dd, J=8.0, 7.2 Hz), 7.43-7.47 (2H, m), 7.32-7.40 (6H, m), 7.19-7.25 (4H, m), 7.10-7.16 (5H, m), 4.87-4.90 (1H, m), 4.08-4.12 (1H, m), 2.10-2.20 (1H, m), 1.93-2.00 (1H, m), 1.83-1.90 (1H, m), 1.73-1.82 (1H, m), 1.63-1.72 (1H, m), 1.38-1.48 (1H, m)

<Dye for Comparison>

Dyes for comparison will be listed next.

[Chemical 18]

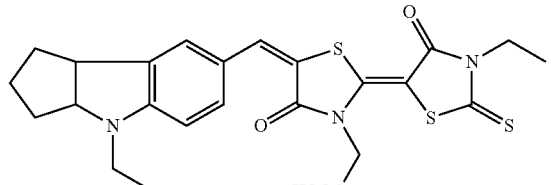

D-01

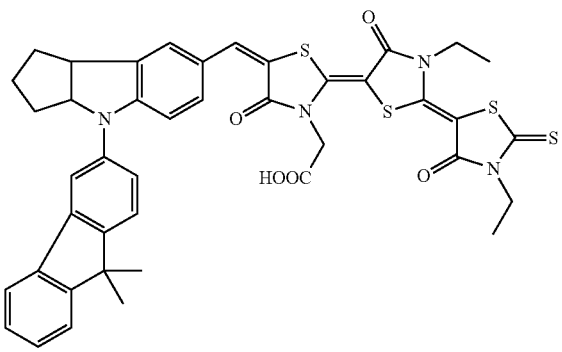

D-02

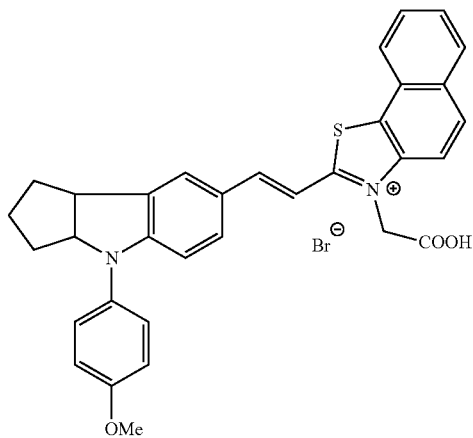

D-03

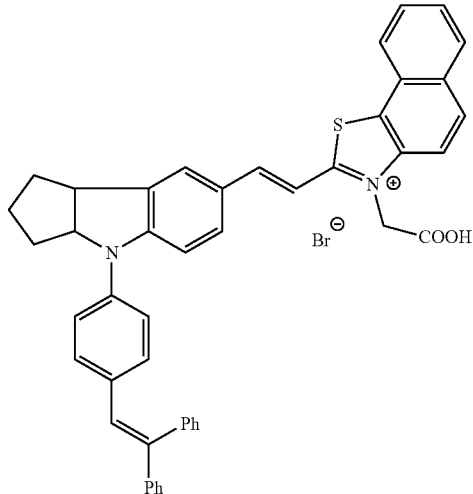

D-04

-continued

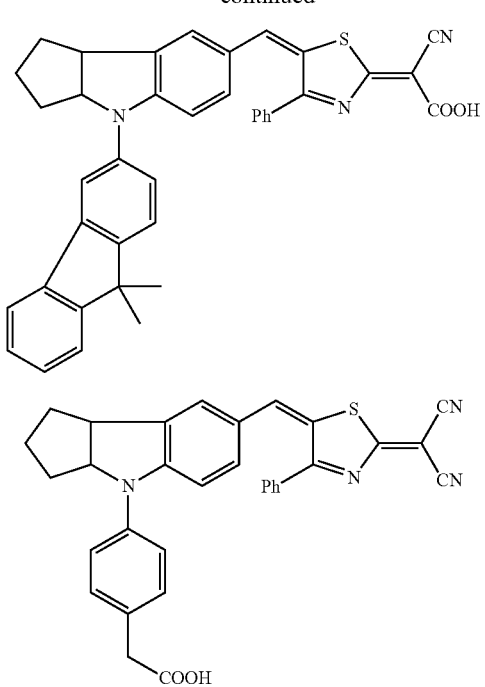

D-05

D-06

[Production of Photoelectric Conversion Device]
(Production of Photoelectrode Layer)

An FTO glass with an FTO electrode coating formed on one of its surfaces was used as an electrode substrate, and titanium oxide paste (manufactured by JGC Catalysts and Chemicals Ltd., PST-18NR) was applied to the electrode surface of this FTO glass by using a squeegee method. After the paste was dried at 125° C. for 6 minutes, the paste was fired at 325° C. for 5 minutes, and at 375° C. for 5 minutes, and at 450° C. for 15 minutes, and at 500° C. for 15 minutes. Accordingly, a titanium oxide coating with the coating thickness of 10 μm was formed. Each of dyes obtained in Examples 1 through 13 and Comparative Examples 1 through 6 was dissolved in acetonitrile/t-butyl alcohol=1/1 to get the concentration of 200 μM, and the FTO glass with this titanium oxide coating formed was immersed in this solution for 90 minutes. Accordingly, photoelectric conversion layer was produced. Here, cholic acid was added, as an additive, to get the concentration of cholic acid of 0.4 mM.
(Formation of Electrolyte Layer)

1,2-dimethyl-3-propylimidazolium iodide, iodine, lithium iodide and 4-t-butylpyridine were mixed into 3-methoxypropionitrile solution so as to be 1,2-dimethyl 3-propylimidazolium iodide (0.60 M), iodine (0.05M), lithium iodide (0.10 M) and 4-t-butylpyridine (0.05 M), and this was used as electrolyte solution. An electrolyte layer was formed by arranging this electrolyte solution between a counter substrate using the same FTO glass as the electrode substrate and the aforementioned photoelectrode layer.

<Evaluation>

Each of the photoelectric conversion devices (light receiving area is 0.20 cm$^2$) produced as described above was illuminated at the illumination intensity of 100 mW/cm$^2$ by using "CEP-2000" manufactured by Bunkoukeiki Co., Ltd., and short circuit current (mA) and open circuit voltage (V) of the photoelectric conversion devices were measured, and short circuit current density (mA/cm$^2$) was obtained from the short circuit current and the light receiving area. Next, maximum power Wmax(mW) was observed by changing a resistance value connected between the electrodes of the photoelectric conversion device, and fill factor FF and photoelectric conversion efficiency (%) were obtained by the following expressions. Table 1 shows an evaluation result in the case of using titanium oxide. Further, Table 2 shows an evaluation result in the case that zinc oxide was used instead of titanium oxide in production of the photoelectrode layer.

$$FF = \frac{W\max(mW)}{\text{Short Circuit Current(mA)} \times \text{Open Circuit Voltage}(V)}$$ [Mathematicla 1]

$$\text{Photoelectric Conversion Efficiency}(\%) = \frac{\text{Short Circuit Current Display(mA/cm}^2) \times \text{Open Circuit Voltage}(V) \times FF}{100(\text{mW/cm}^2)} \times 100$$ [Mathematical 2]

TABLE 1

| Dye Name | | Hue | Absorption Maximum in CHCl$_3$ (nm) | Short Circuit Current Density (mA/cm$^2$) | Open Circuit Voltage (V) | Fill Factor FF | Photoelectric Conversion Efficiency (%) |
|---|---|---|---|---|---|---|---|
| Comparative Example 1 | D-01 | Reddish Purple | 546 | 9.73 | 0.70 | 0.65 | 3.61 |
| Example 1 | I-03 | | 545 | 12.60 | 0.63 | 0.61 | 4.81 |
| Example 2 | I-05 | | 541 | 11.29 | 0.61 | 0.62 | 4.33 |
| Example 3 | I-06 | | 546 | 12.01 | 0.61 | 0.60 | 4.40 |
| Comparative Example 2 | D-02 | Purple | 598 | 10.44 | 0.54 | 0.61 | 3.47 |
| Example 13 | I-75 | | 595 | 15.38 | 0.59 | 0.58 | 5.22 |
| Comparative Example 3 | D-03 | Bluish Purple | 604 | 9.16 | 0.51 | 0.68 | 3.15 |
| Example 4 | I-26 | | 607 | 15.75 | 0.57 | 0.61 | 5.43 |
| Comparative Example 4 | D-04 | Blue | 616 | 8.94 | 0.48 | 0.60 | 2.57 |
| Example 5 | I-27 | | 616 | 15.75 | 0.56 | 0.58 | 5.10 |
| Example 6 | I-28 | | 619 | 13.47 | 0.56 | 0.66 | 4.97 |
| Example 7 | I-31 | | 617 | 17.72 | 0.58 | 0.57 | 5.85 |
| Example 8 | I-32 | | 621 | 16.58 | 0.59 | 0.58 | 5.69 |
| Comparative Example 5 | D-05 | Indigo-Blue | 647 | 0.41 | 0.37 | 0.73 | 0.11 |
| Example 9 | I-44 | | 642 | 9.25 | 0.46 | 0.67 | 2.88 |
| Example 10 | I-45 | | 647 | 6.90 | 0.49 | 0.71 | 2.41 |

TABLE 1-continued

| Dye Name | | Hue | Absorption Maximum in $CHCl_3$ (nm) | Short Circuit Current Density ($mA/cm^2$) | Open Circuit Voltage (V) | Fill Factor FF | Photoelectric Conversion Efficiency (%) |
|---|---|---|---|---|---|---|---|
| Comparative Example 6 | D-06 | Bluish Green | 658 | 0.44 | 0.34 | 0.71 | 0.11 |
| Example 11 | I-47 | | 655 | 11.02 | 0.49 | 0.65 | 3.50 |
| Example 12 | I-48 | | 661 | 9.50 | 0.51 | 0.67 | 3.25 |

TABLE 2

| Dye Name | | Hue | Absorption Maximum in $CHCl_3$ (nm) | Short Circuit Current Density ($mA/cm^2$) | Open Circuit Voltage (V) | Fill Factor FF | Photoelectric Conversion Efficiency (%) |
|---|---|---|---|---|---|---|---|
| Comparative Example 1 | D-01 | Reddish Purple | 546 | 7.60 | 0.58 | 0.64 | 2.81 |
| Example 3 | I-06 | | 546 | 9.82 | 0.60 | 0.60 | 3.53 |
| Comparative Example 4 | D-04 | Blue | 616 | 1.59 | 0.52 | 0.79 | 0.66 |
| Example 7 | I-31 | | 617 | 11.54 | 0.62 | 0.59 | 4.22 |
| Example 8 | I-32 | | 621 | 10.23 | 0.64 | 0.59 | 3.86 |
| Comparative Example 6 | D-06 | Bluish Green | 658 | 0.35 | 0.31 | 0.60 | 0.07 |
| Example 12 | I-48 | | 661 | 7.11 | 0.51 | 0.65 | 2.35 |

As Table 1 shows, in all of the examples in which the dye of the present disclosure was used as a photosensitizer, an improvement in photoelectric conversion efficiency was observed, compared with comparative examples, in which dye of corresponding hue was used. It was possible to improve the photoelectric conversion efficiency for all of the hues from reddish purple to bluish green. The improvement in the conversion efficiency was great especially in the region of bluish purple to bluish green, which is 600 to 700 nm. It was able to obtain dye of practical use level that can cover a wide range of hue.

Further, as Table 2 shows, a great improvement in photoelectric conversion efficiency was recognized also for zinc oxide.

As the examples clearly show, the photosensitizer of the present disclosure can improve the adsorption stability of dye as well as improving the photoelectric conversion efficiency. Further, since a wide range of hue is coverable, the dye of the present disclosure is usable in a dye-sensitized solar cell, the design characteristics of which are also emphasized. Further, it is possible to obtain photoelectric conversion efficiency that is not inferior to titanium oxide even for zinc oxide, which is excellent electrode material.

What is claimed is:

1. A photosensitizer that is a dye represented by the following formula (I) or its salt;

[Chemical 1]

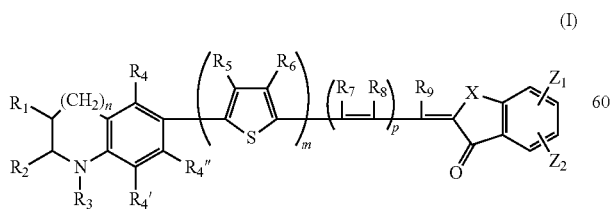

(I)

wherein, m represents an integer of 0 through 4; n represents an integer of 0 or 1; p represents an integer of 0 to 2; $R_1$ and $R_2$ each represent a hydrogen atom, an alkyl group, or an aryl group, and $R_1$ and $R_2$ may bind with to each other to form an aromatic ring or an aliphatic ring; $R_3$ represents an alkyl group, an aryl group, an aralkyl group, or a heterocyclic residue; $R_4$, $R_4'$ and $R_4''$ each represent a hydrogen atom, an alkyl group, an aralkyl group, an alkoxy group, a substituted amino group, or a halogen atom, and $R_4'$ and $R_4''$ may bind with each other to form a ring structure; $R_5$ and $R_6$ each represent a hydrogen atom, an alkyl group, an alkoxy group, or an alkylthio group, and $R_5$ and $R_6$ may bind with each other to form a ring structure; $R_7$, $R_8$ and $R_9$ each represent a hydrogen atom, an alkyl group, an aralkyl group, an alkenyl group, or an aryl group, and $R_7$ and $R_8$ may bind with each other or $R_8$ and $R_9$ may bind with each other to form an aliphatic ring; X represents an oxygen atom, an alkylene group, or a carbonyl group; and $Z_1$ and $Z_2$ each represent a hydrogen atom, a hydroxyl group, a carboxyl group, an alkoxycarbonyl group, a sulfone group, or a substituted amino group, but there is no case where both $Z_1$ and $Z_2$ are hydrogen atoms at the same time;

wherein formula (I) includes at least one of the members identified in sections (i) and (ii) below:
(i) a hydroxyl group, a carboxyl group, an alkoxycarbonyl group, a sulfonic acid group, a phosphonyl group, a phosphoryl group, and salts thereof; and
(ii) a carboxyvinylene group, a dicarboxyvinylene group, a cyanocarboxyvinylene group, and a carboxyphenyl group.

2. A photoelectric conversion device comprising a light absorption layer including the photosensitizer as defined in claim 1.

* * * * *